(12) United States Patent
Hazeghi et al.

(10) Patent No.: US 9,548,124 B1
(45) Date of Patent: Jan. 17, 2017

(54) WORD LINE DEPENDENT PROGRAMMING IN A MEMORY DEVICE

(71) Applicant: SanDisk Technologies Inc., Plano, TX (US)

(72) Inventors: Arash Hazeghi, San Francisco, CA (US); Gerrit Jan Hemink, San Ramon, CA (US); Dana Lee, Saratoga, CA (US); Henry Chin, Fremont, CA (US); Bo Lei, San Ramon, CA (US); Zhenming Zhou, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/882,858

(22) Filed: Oct. 14, 2015

(51) Int. Cl.
| | | |
|---|---|---|
| *G11C 16/10* | (2006.01) | |
| *G11C 16/04* | (2006.01) | |
| *G11C 16/34* | (2006.01) | |
| *G11C 16/20* | (2006.01) | |
| *G11C 16/26* | (2006.01) | |

(52) U.S. Cl.
 CPC ............ *G11C 16/20* (2013.01); *G11C 16/26* (2013.01); *G11C 16/349* (2013.01); *G11C 16/0483* (2013.01); *G11C 16/10* (2013.01); *G11C 16/34* (2013.01); *G11C 16/3495* (2013.01)

(58) Field of Classification Search
 CPC ... G11C 16/10; G11C 16/0483; G11C 16/349; G11C 16/34; G11C 16/3495
 USPC ............ 365/185.19, 185.24, 185.03, 185.17, 365/185.22
 See application file for complete search history.

(56) References Cited

U.S. PATENT DOCUMENTS

| | | |
|---|---|---|
| 7,259,987 B2 | 8/2007 | Chen et al. |
| 7,468,919 B2 | 12/2008 | Sekar et al. |
| 7,688,632 B2 | 3/2010 | Nagashima et al. |
| 7,808,819 B2 | 10/2010 | Murin et al. |
| 7,808,836 B2 | 10/2010 | Murin et al. |
| 7,839,687 B2 | 11/2010 | Dutta et al. |
| 7,881,116 B2 | 2/2011 | Nagashima et al. |
| 7,978,520 B2 | 7/2011 | Mokhlesi et al. |
| 8,073,648 B2 | 12/2011 | Shlick et al. |

(Continued)

OTHER PUBLICATIONS

Ludwig, Christoph, et al., "Double Patterning for Memory ICs," Recent Advances in Nanofabrication Techniques and Applications, [www.intechopen.com], Dec. 2011, 17 pages.

(Continued)

*Primary Examiner* — Ly D Pham
(74) *Attorney, Agent, or Firm* — Vierra Magen Marcus LLP

(57) ABSTRACT

A memory device includes memory cells arranged in word lines. Due to variations in the fabrication process, with width and spacing between word lines can vary, resulting in widened threshold voltage distributions. In one approach, a programming parameter is optimized for each word line based on a measurement of the threshold voltage distributions in an initial programming operation. An adjustment to the programming parameter of a word line can be based, e.g., on measurements from adjacent word lines, and a position of the word line in a set of word lines. The programming parameter can include a programming mode such as a number of programming passes. Moreover, the programming parameters from one set of word lines can be used for another set of word lines having a similar physical layout due to the variations in the fabrication process.

20 Claims, 21 Drawing Sheets

(56) References Cited

U.S. PATENT DOCUMENTS

| | | |
|---|---|---|
| 8,116,141 B2 | 2/2012 | Yoo et al. |
| 8,248,850 B2 | 8/2012 | Dutta et al. |
| 8,472,255 B2 | 6/2013 | Mokhlesi et al. |
| 8,605,514 B2 | 12/2013 | Shiino et al. |
| 8,804,425 B2 | 8/2014 | Chen et al. |
| 8,874,825 B2 | 10/2014 | Alrod et al. |
| 8,891,303 B1 | 11/2014 | Higgins et al. |
| 9,070,454 B1 | 6/2015 | Wu et al. |
| 2010/0037032 A1* | 2/2010 | Achter ............... G11C 16/3427 711/170 |
| 2013/0275651 A1* | 10/2013 | D'Abreu ............. G11C 11/5628 711/103 |
| 2014/0351496 A1 | 11/2014 | Avila et al. |
| 2015/0117099 A1 | 4/2015 | Raghu et al. |

OTHER PUBLICATIONS

Seo, Jog Yun, et al., "Investigation into the Effect of the Variation of Gate Dimensions on Program Characteristics in 3D NAND Flash Array," IEEE Silicon Nanoelectronics Workshop (SNW), Jun. 2012, 2 pages.

\* cited by examiner

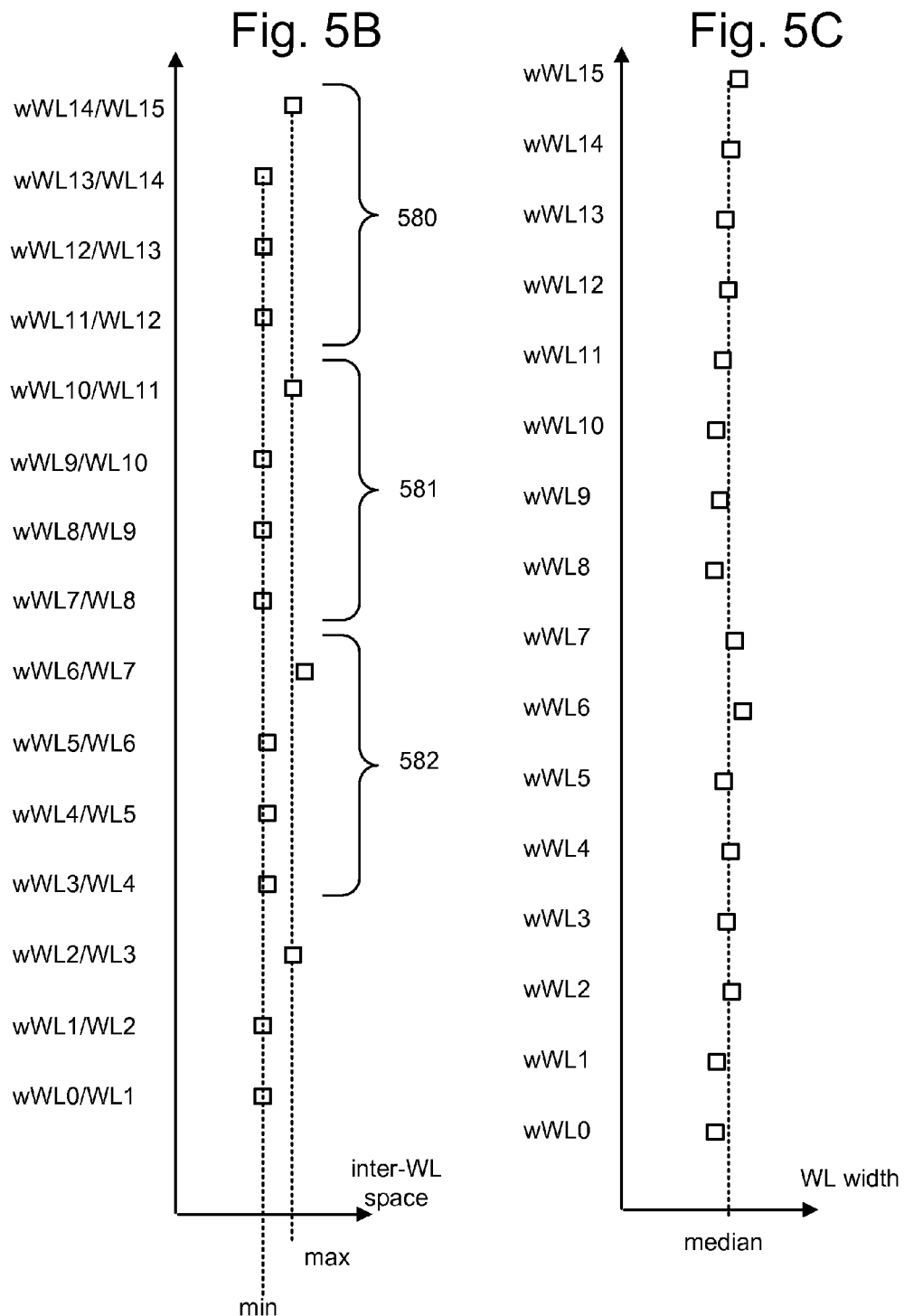

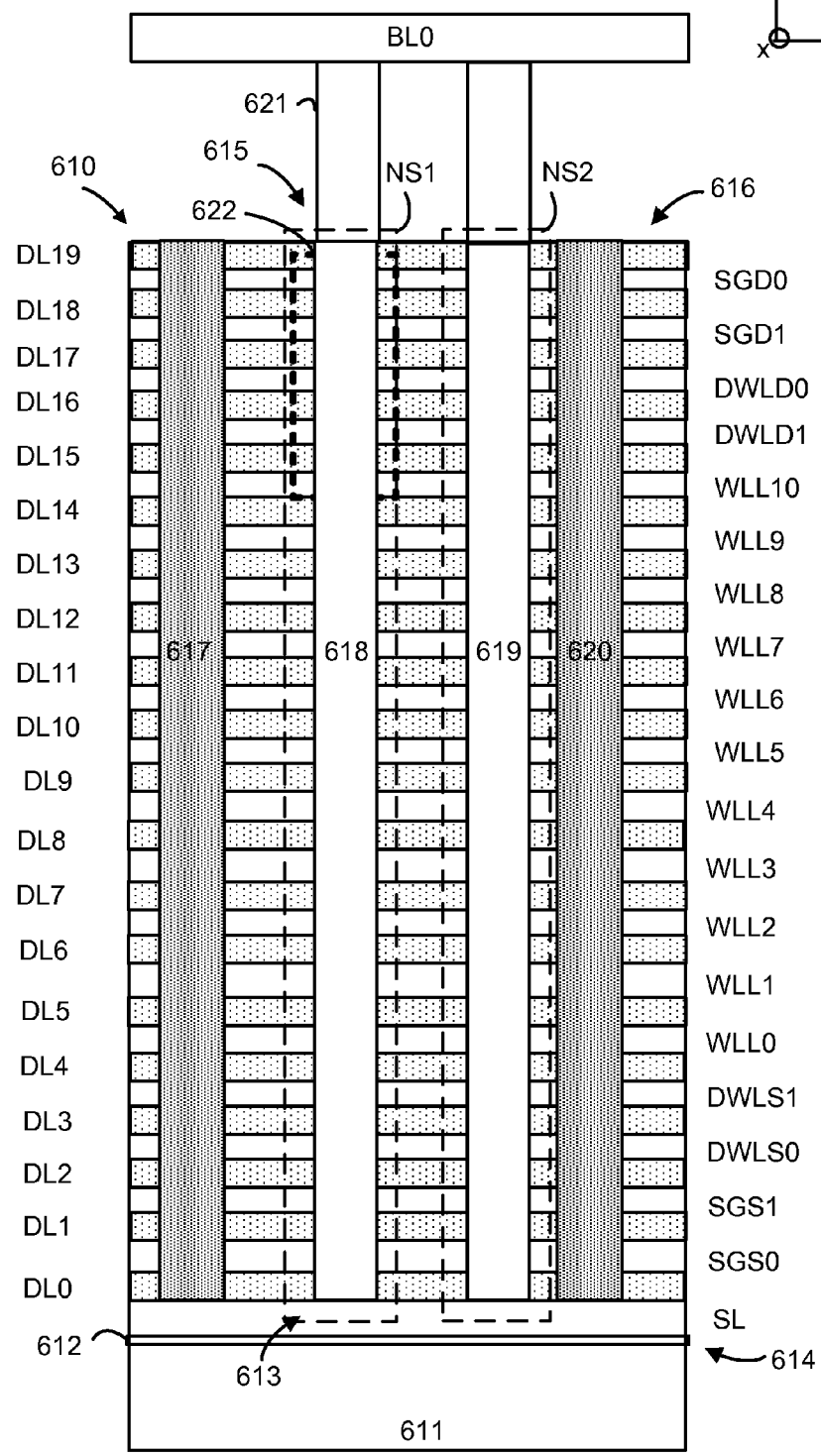
Fig. 6B
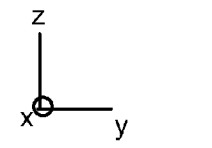
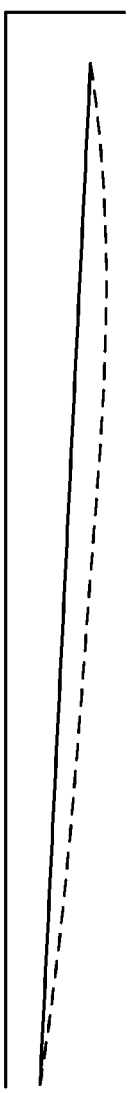
Fig. 6C

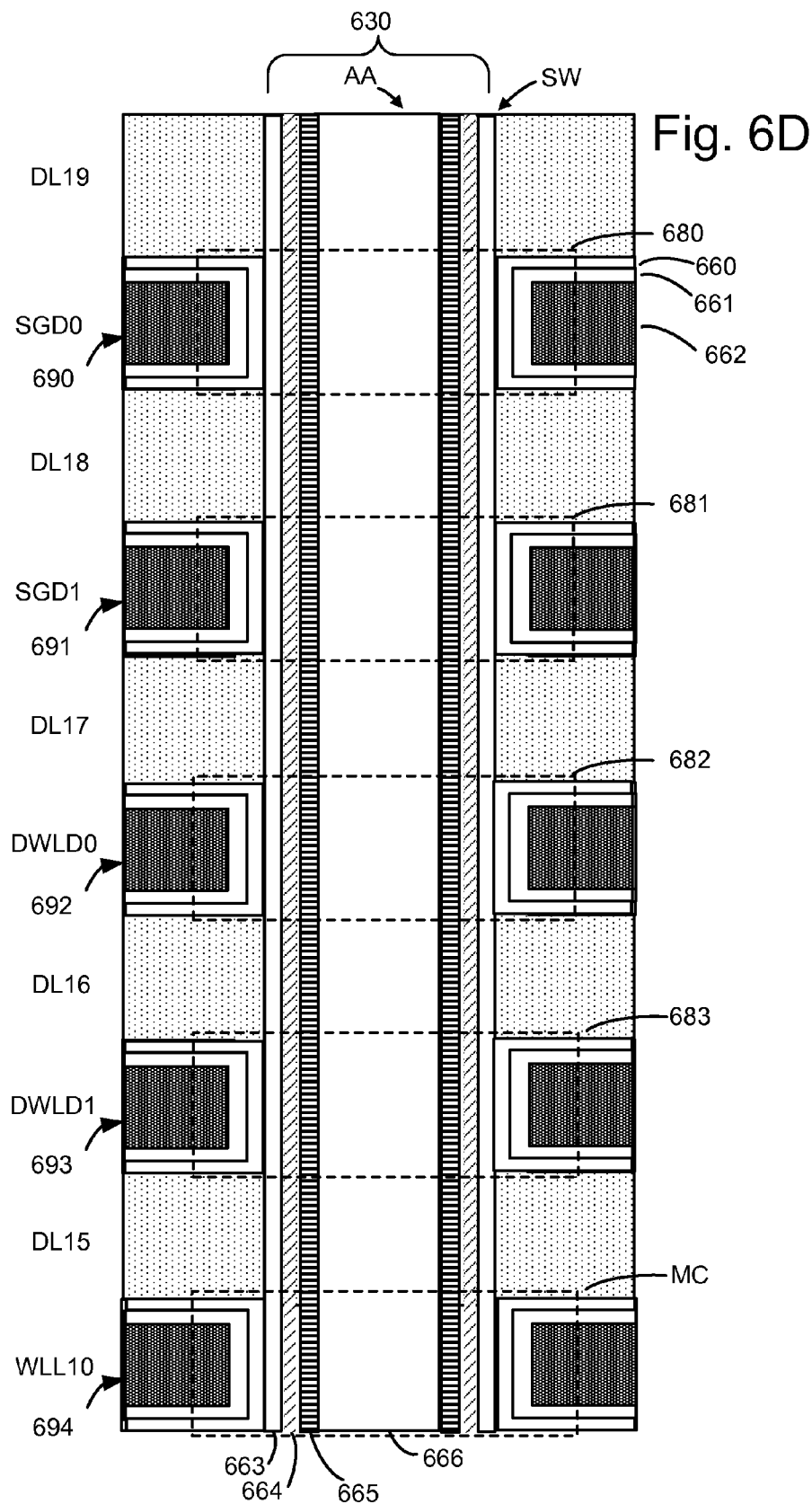

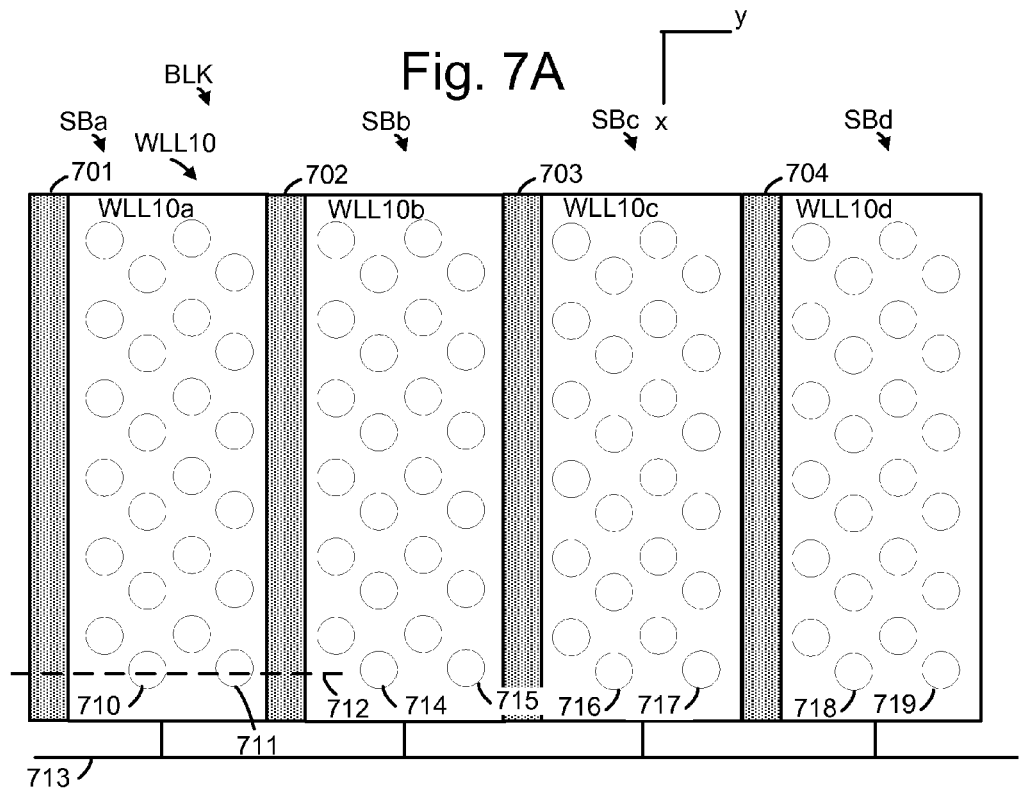
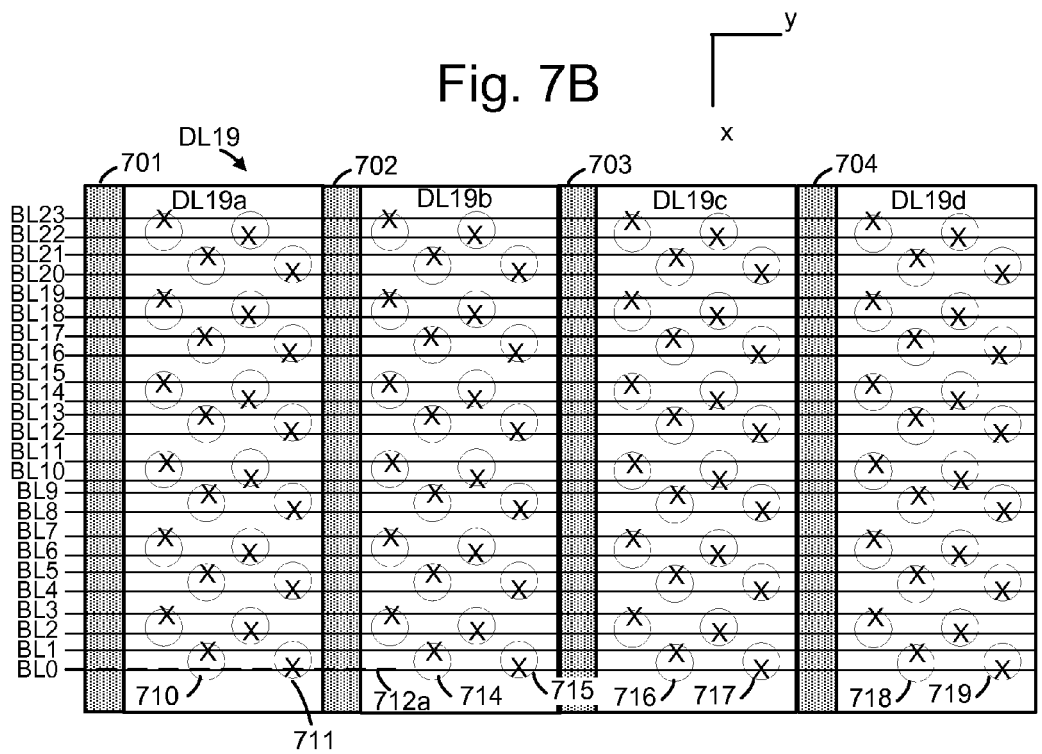

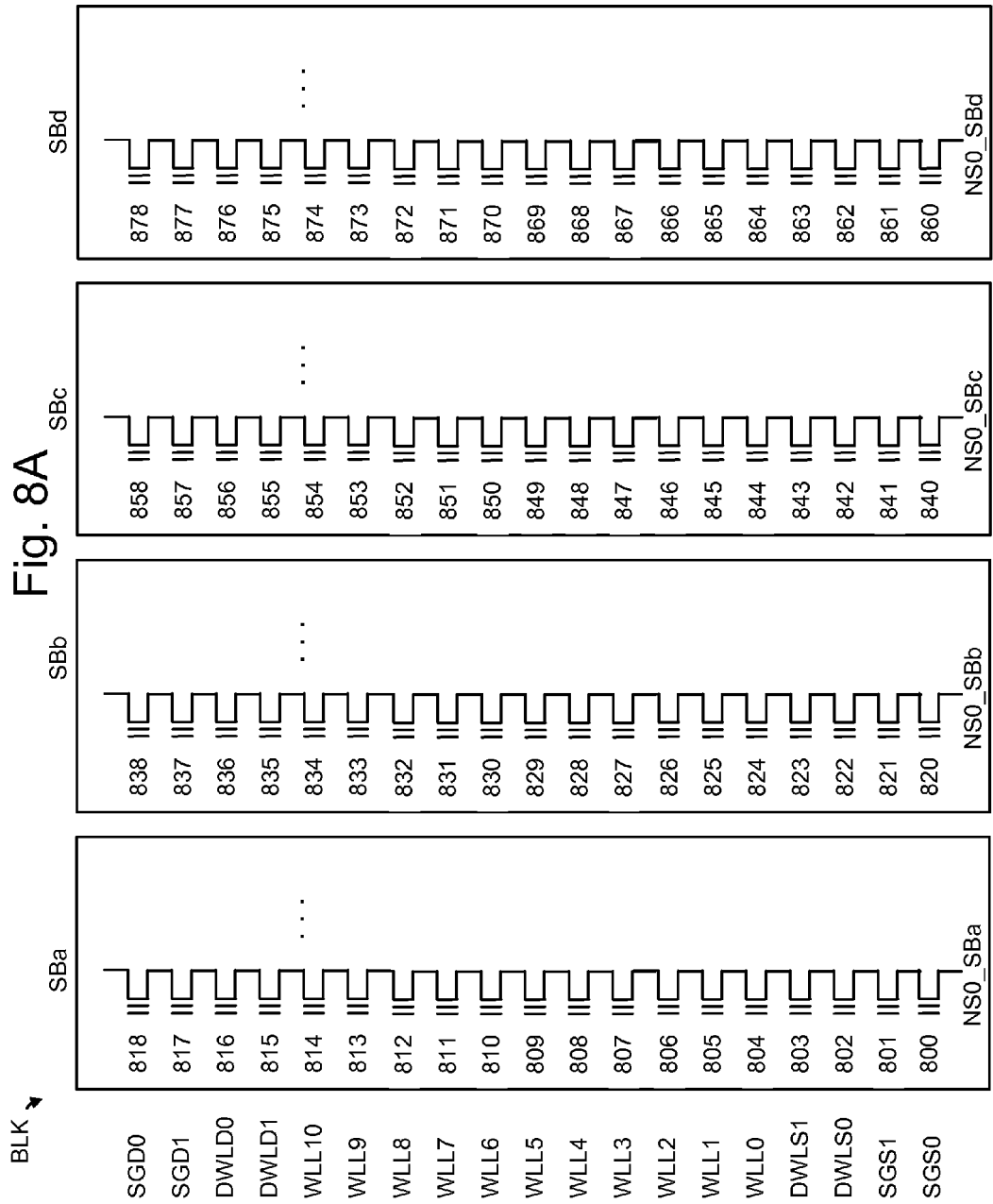

Fig. 8B

| SBa | | SBb | |
|---|---|---|---|
| DL19a | wDL19a | DL19b | wDL19b |
| SGD0a | wSGD0a | SGD0b | wSGD0b |
| DL18a | wDL18a | DL18b | wDL18b |
| SGD1a | wSGD1a | SGD1b | wSGD1b |
| DL17a | wDL17a | DL17b | wDL17b |
| DWLD0a | wDWLD0a | DWLD0b | wDWLD0b |
| DL16a | wDL16a | DL16b | wDL16b |
| DWLD1a | wDWLD1a | DWLD1b | wDWLD1b |
| DL15a | wDL15a | DL15b | wDL15b |
| WLL10a | wWLL10a | WLL10b | wWLL10b |
| DL14a | wDL14a | DL14b | wDL14b |
| WLL9a | wWLL9a | WLL9b | wWLL9b |
| DL13a | wDL13a | DL13b | wDL13b |
| WLL8a | wWLL8a | WLL8b | wWLL8b |
| DL12a | wDL12a | DL12b | wDL12b |
| WLL7a | wWLL7a | WLL7b | wWLL7b |
| DL11a | wDL11a | DL11b | wDL11b |
| WLL6a | wWLL6a | WLL6b | wWLL6b |
| DL10a | wDL10a | DL10b | wDL10b |
| WLL5a | wWLL5a | WLL5b | wWLL5b |
| DL9a | wDL9a | DL9b | wDL9b |
| WLL4a | wWLL4a | WLL4b | wWLL4b |
| DL8a | wDL8a | DL8b | wDL8b |
| WLL3a | wWLL3a | WLL3b | wWLL3b |
| DL7a | wDL7a | DL7b | wDL7b |
| WLL2a | wWLL2a | WLL2b | wWLL2b |
| DL6a | wDL6a | DL6b | wDL6b |
| WLL1a | wWLL1a | WLL1b | wWLL1b |
| DL5a | wDL5a | DL5b | wDL5b |
| WLL0a | wWLL0a | WLL0b | wWLL0b |
| DL4a | wDL4a | DL4b | wDL4b |
| DWLS1a | wDWLS1a | DWLS1b | wDWLS1b |
| DL3a | wDL3a | DL3b | wDL3b |
| DWLS0a | wDWLS0a | DWLS0b | wDWLS0b |
| DL2a | wDL2a | DL2b | wDL2b |
| SGS1a | wSGS1a | SGS1b | wSGS1b |
| DL1a | wDL1a | DL1b | wDL1b |
| SGS0a | wSGS0a | SGS0b | wSGS0b |
| DL0a | wDL0a | DL0b | wDL0b |

Fig. 11A
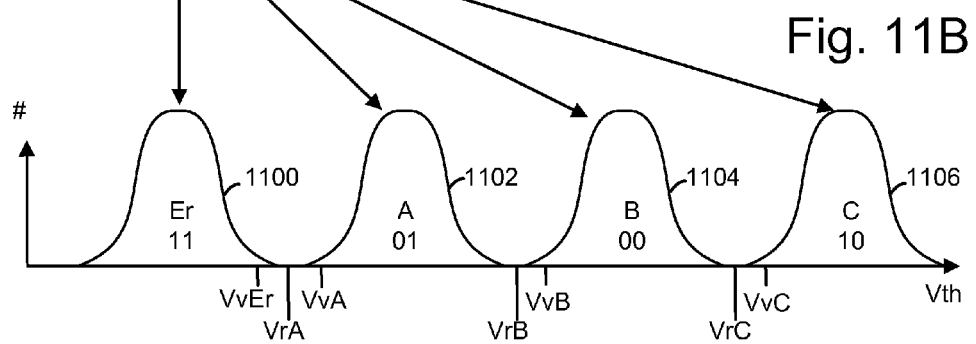
Fig. 11B
Fig. 11C
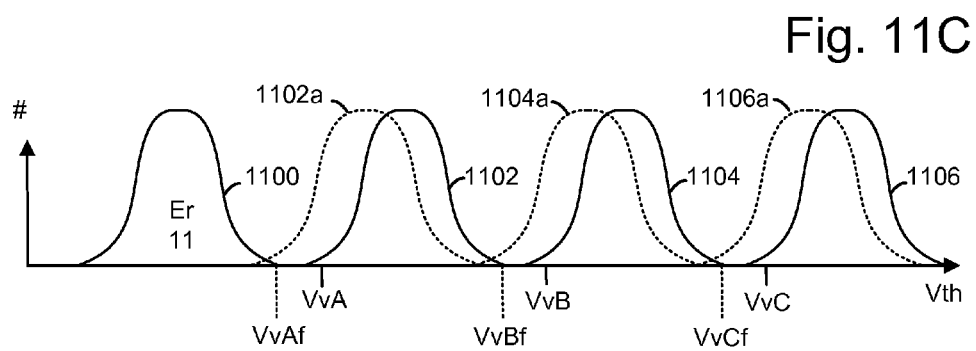
Fig. 11D
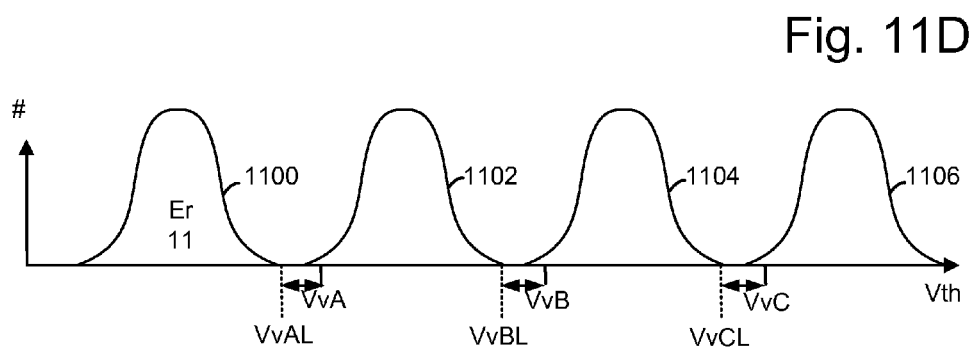

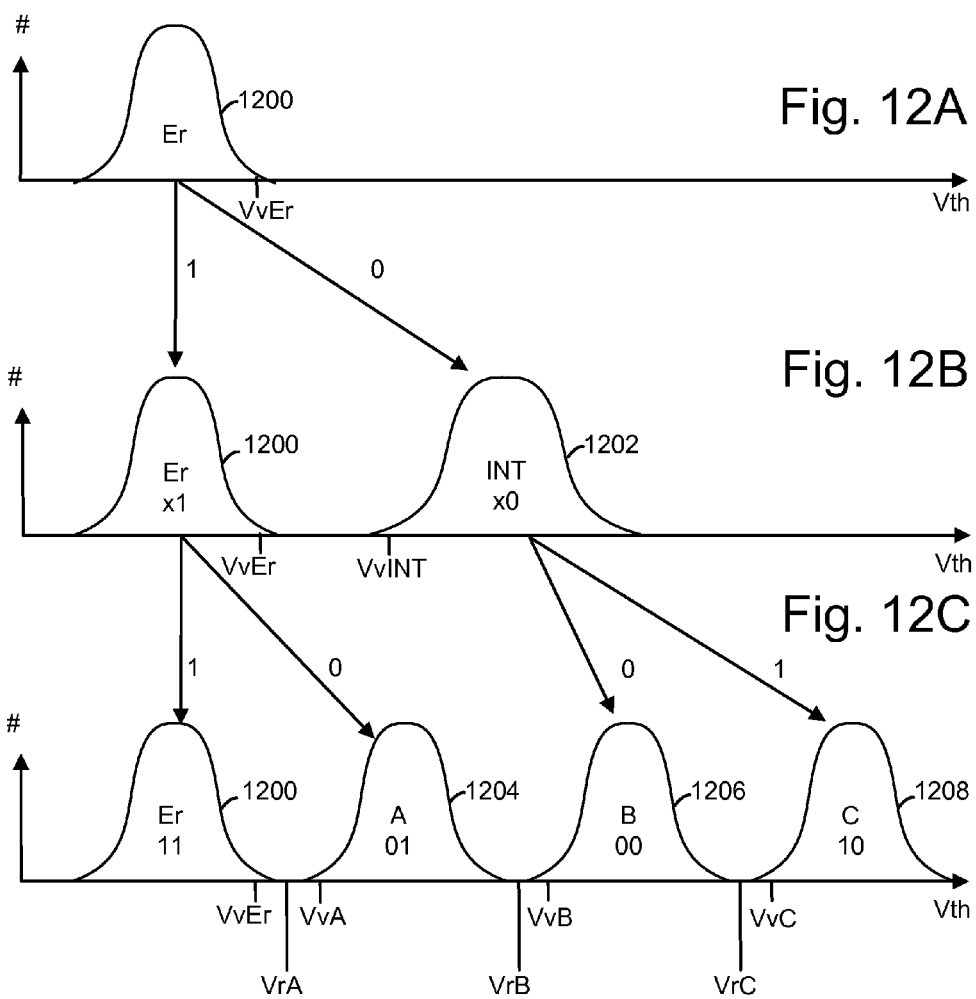

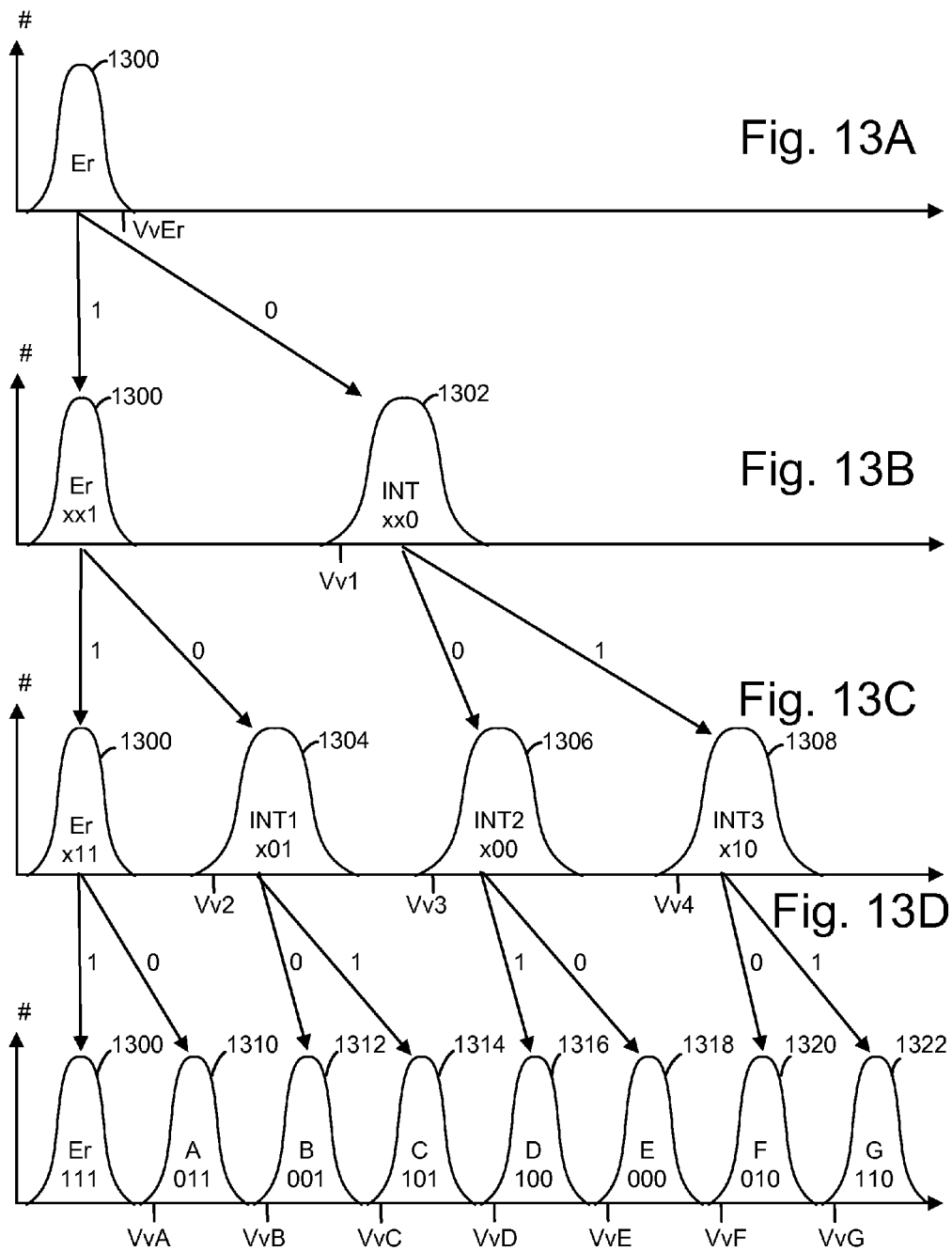

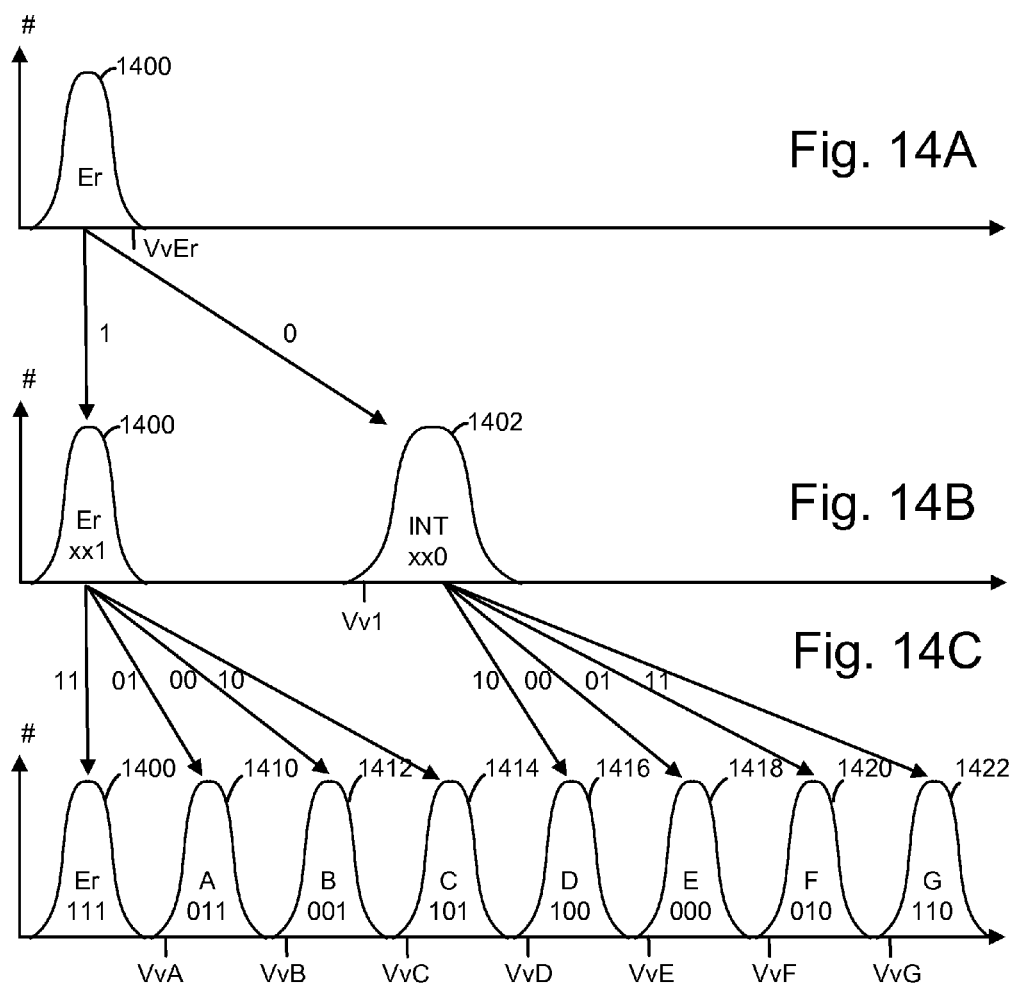

WORD LINE DEPENDENT PROGRAMMING IN A MEMORY DEVICE

BACKGROUND

The present technology relates to operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 5B is an example plot of the widths of the spaces between the word lines of FIG. 5A.

FIG. 5C is an example plot of the widths of the word lines of FIG. 5A.

FIG. 6B depicts an example cross-sectional view of a portion of one of the blocks of FIG. 6A.

FIG. 6C depicts a plot of memory hole diameter in the stack of FIG. 6B.

FIG. 6D depicts a close-up view of the region 622 of the stack of FIG. 6B.

FIG. 7A depicts a top view of an example word line layer WLL10 of the stack of FIG. 6B.

FIG. 7B depicts a top view of an example top dielectric layer DL19 of the stack of FIG. 6B.

FIG. 8A depicts example NAND strings in the sub-blocks SBa-SBd of FIG. 7A.

FIG. 8B depicts the sub-blocks SBa and SBb of FIG. 8A, showing the widths of word lines and the spaces between word lines.

FIG. 8C is an example plot of the widths of the spaces between the word lines of FIG. 8B.

FIG. 8D is an example plot of the widths of the word lines of FIG. 8B.

FIGS. 11A and 11B depict Vth distributions of memory cells in an example one-pass programming operation with four data states, consistent with FIG. 9A-9C.

FIG. 11C depicts Vth distributions of memory cells after a first pass (a foggy pass) and a second pass (a fine pass) of an example two-pass programming operation with four data states, consistent with FIG. 9A-9C.

FIG. 11D depicts Vth distributions of memory cells in a one-pass programming operation which uses a slowdown measure.

FIG. 12A to 12C depict Vth distributions of memory cells in a two-pass programming operation with four data states, consistent with FIG. 9A-9C.

FIG. 13A to 13D depict Vth distributions of memory cells in a three-pass programming operation with eight data states, consistent with FIG. 9A-9C.

FIG. 14A to 14C depict Vth distributions of memory cells in a two-pass programming operation with eight data states, consistent with FIG. 9A-9C.

DETAILED DESCRIPTION

Figure 1:
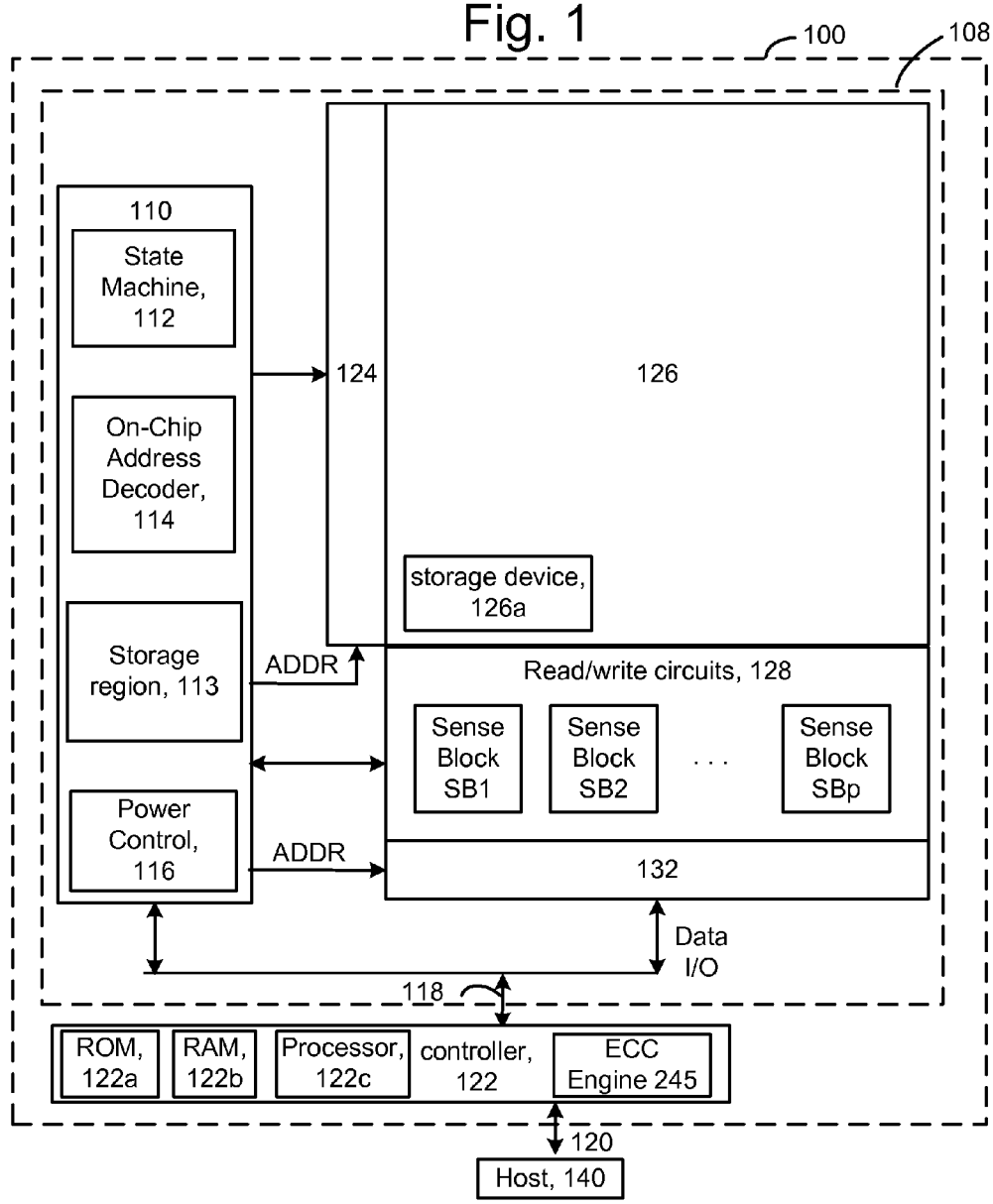
FIG. 1 is a block diagram of an example memory device.

Techniques are provided for operating a memory device which account for variations in memory cell size and spacing. In one aspect, a programming operation is performed in which each word line is programmed using customized programming parameters. A corresponding memory device is also provided.

In some memory devices, memory cells are joined to one another such as in NAND strings. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. However, when the memory device is fabricated, non-uniformities result due to variations in the fabrication process. This can result in variations in the physical dimensions of the memory cells and the distances between them. For example, the word line width and the width of the area between the word lines can vary. These variations will lead to an increase in the threshold voltage (Vth) distributions of the memory cells and a corresponding increase in errors when an attempt is made to read back data from the memory cells.

In one aspect, techniques provided herein include evaluating the Vth distribution of a set of memory cells connected to a word line and adjusting one or more programming parameters for use in subsequent programming involving the word line. The programming parameters which are adjusted can include program voltage step size, initial program voltage, the delay between program and verify, program voltage duration and stabilization time, program-verify voltage, and program mode. The program mode can include, e.g., number of programming passes, word line programming order and whether a slow programing speed is used. The evaluating of the Vth distribution can include reading the upper tail of a Vth distribution of a selected data state and counting a number of memory cells which have a Vth which exceeds a read voltage.

In another aspect, repeating patterns in word line width/distance are considered. Repeating patterns due to the fabrication process may be known in advance. For instance, in a two-dimensional memory device, a double spacer patterning process may result in a pattern which repeats in sets of four adjacent word lines.

Another example of a repeating pattern is in a three-dimensional memory device, where the height of the conductive layers which provide the word lines and the height of the dielectric layers which separate the word lines, can vary due to the fabrication process. Since adjacent subsets of layers are formed from the same common layers which are subsequently divided in the fabrication process, the pattern of one subset can be expected to be similar in another subset. The knowledge of a repeating pattern can save processing time. In one approach, one or more adjusted programming parameters which are optimized for a first set of word lines can be used as the initial programming parameters for a second set of word lines which are arranged in a common pattern as the first set of word lines. The initial programming parameters for the second set of word lines should be optimal so that an optimization step can be avoided for the second set of word lines.

Various other features and benefits are described below.

FIG. 1 is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for programming parameters as described herein. The storage region can also be used to identify low-count, medium-count and high-count word lines and to store an indication of the count, as described further below, e.g., in connection with steps 906 and 907 of FIG. 9A.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
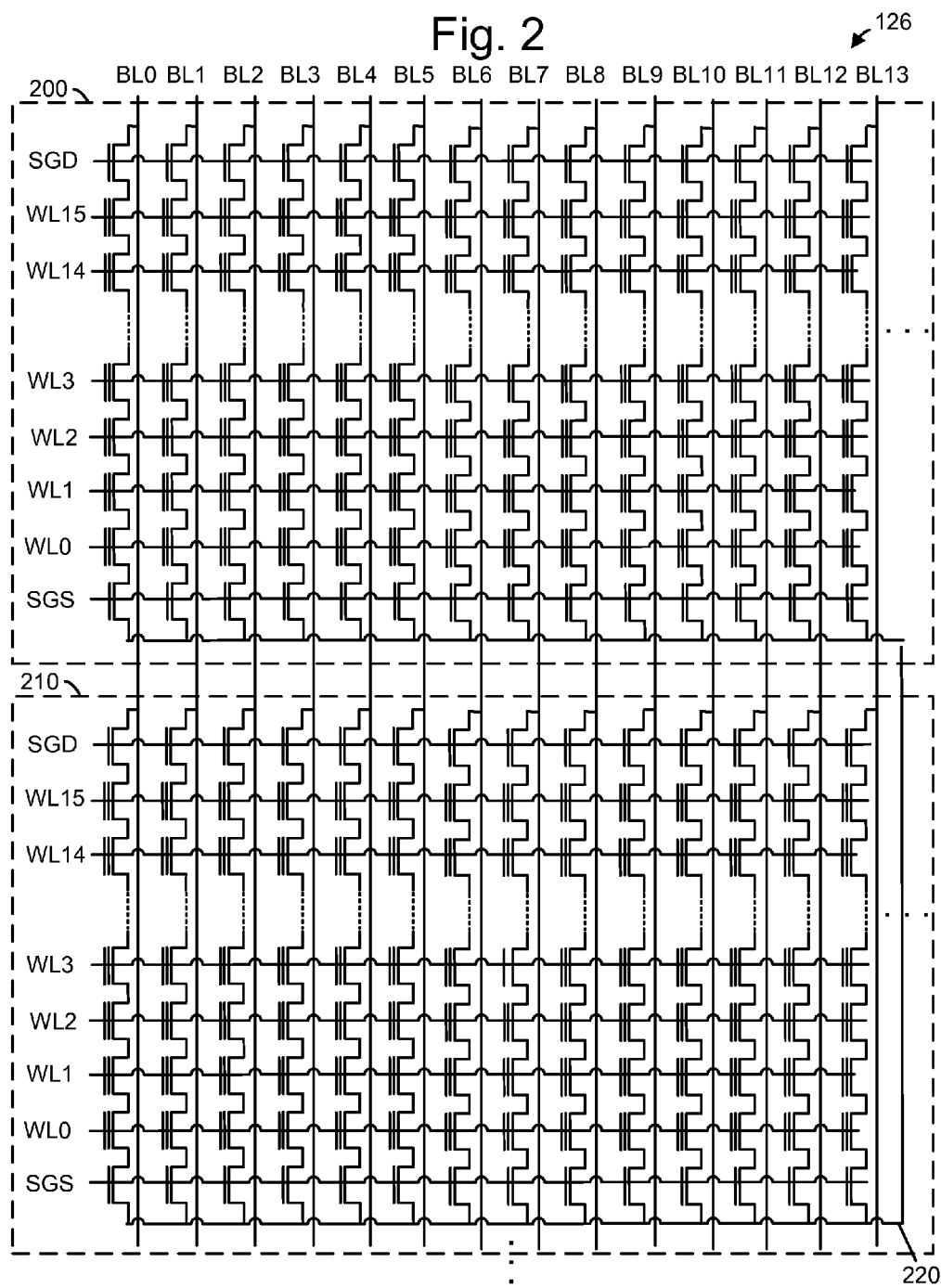
FIG. 2 depicts blocks of memory cells in an example two-dimensional configuration of the memory array 126 of FIG. 1.

FIG. 2 depicts blocks of memory cells in an example two-dimensional configuration of the memory array 126 of FIG. 1. The memory array can include many blocks. Each example block 200, 210 includes a number of NAND strings and respective bit lines, e.g., BL0, BL1, ... which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
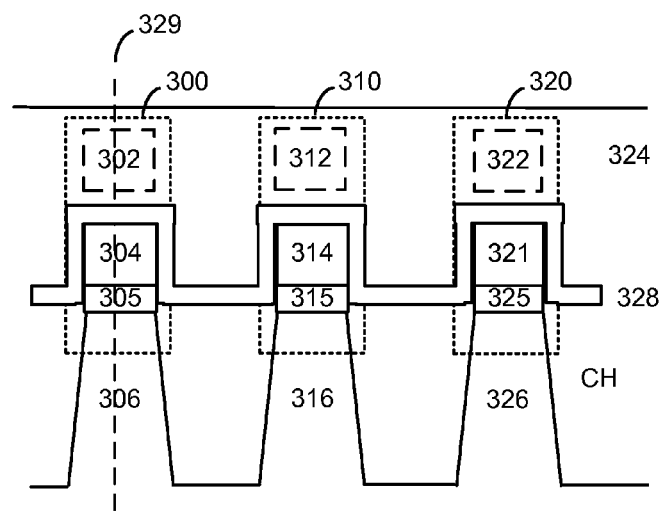
FIG. 3A depicts a cross-sectional view of example floating gate memory cells in NAND strings.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 324, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
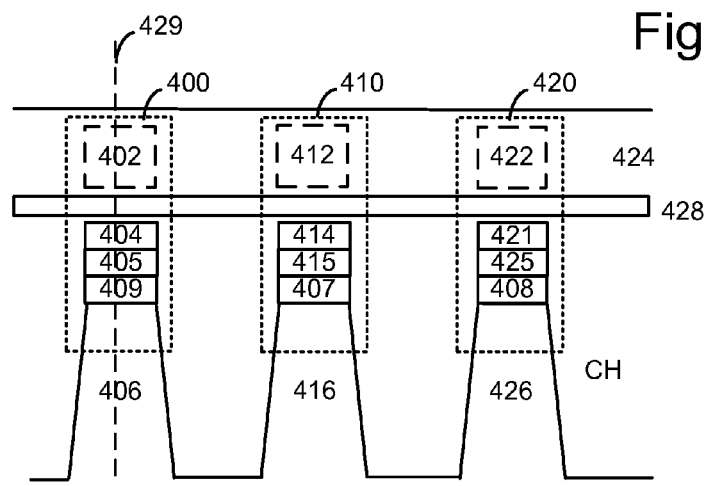
FIG. 4A depicts a cross-sectional view of example charge-trapping memory cells in NAND strings.
Figure 4B:
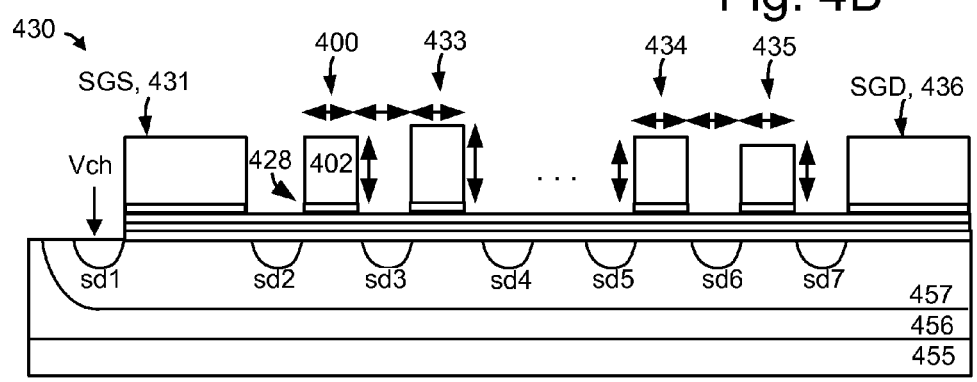
FIG. 4B depicts a cross-sectional view of the structure of FIG. 4A along line 429.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
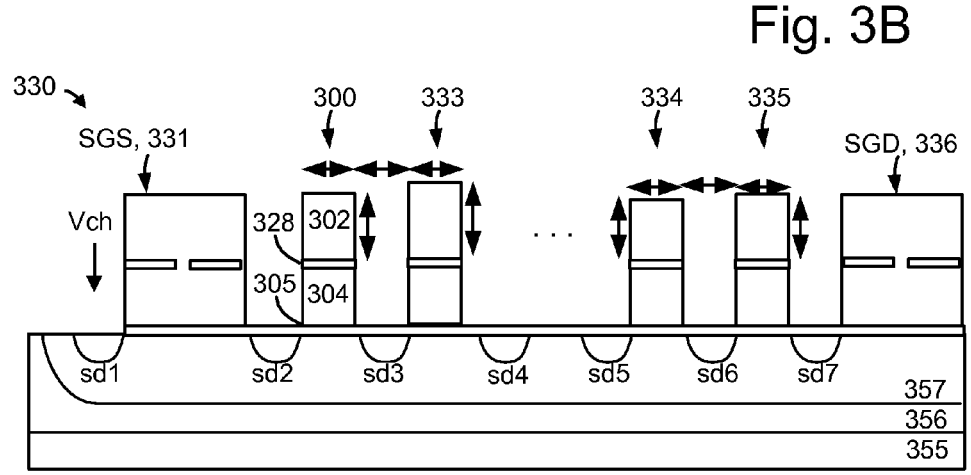
FIG. 3B depicts a cross-sectional view of the structure of FIG. 3A along line 329.

FIG. 3B depicts a cross-sectional view of the structure of FIG. 3A along line 329. The NAND string 330 includes an SGS transistor 331, example memory cells 300, 333, ..., 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N-O-N-O-N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

Each memory cell can have slightly different dimensions due to variations in the fabrication process. For example, the vertical arrows indicate respective heights of the control gates/word lines of the memory cells, while the horizontal arrows indicate respective widths of the control gates/word lines of the memory cells, and of respective inter-word line distances or spaces between the control gates/word lines.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 435.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

As before, each memory cell can have slightly different dimensions due to variations in the fabrication process. The vertical arrows indicate respective heights of the control gates/word lines of the memory cells, while the horizontal arrows indicate respective widths of the control gates/word lines of the memory cells, and of respective inter-word line distances or spaces between the control gates/word lines.

Figure 5A:
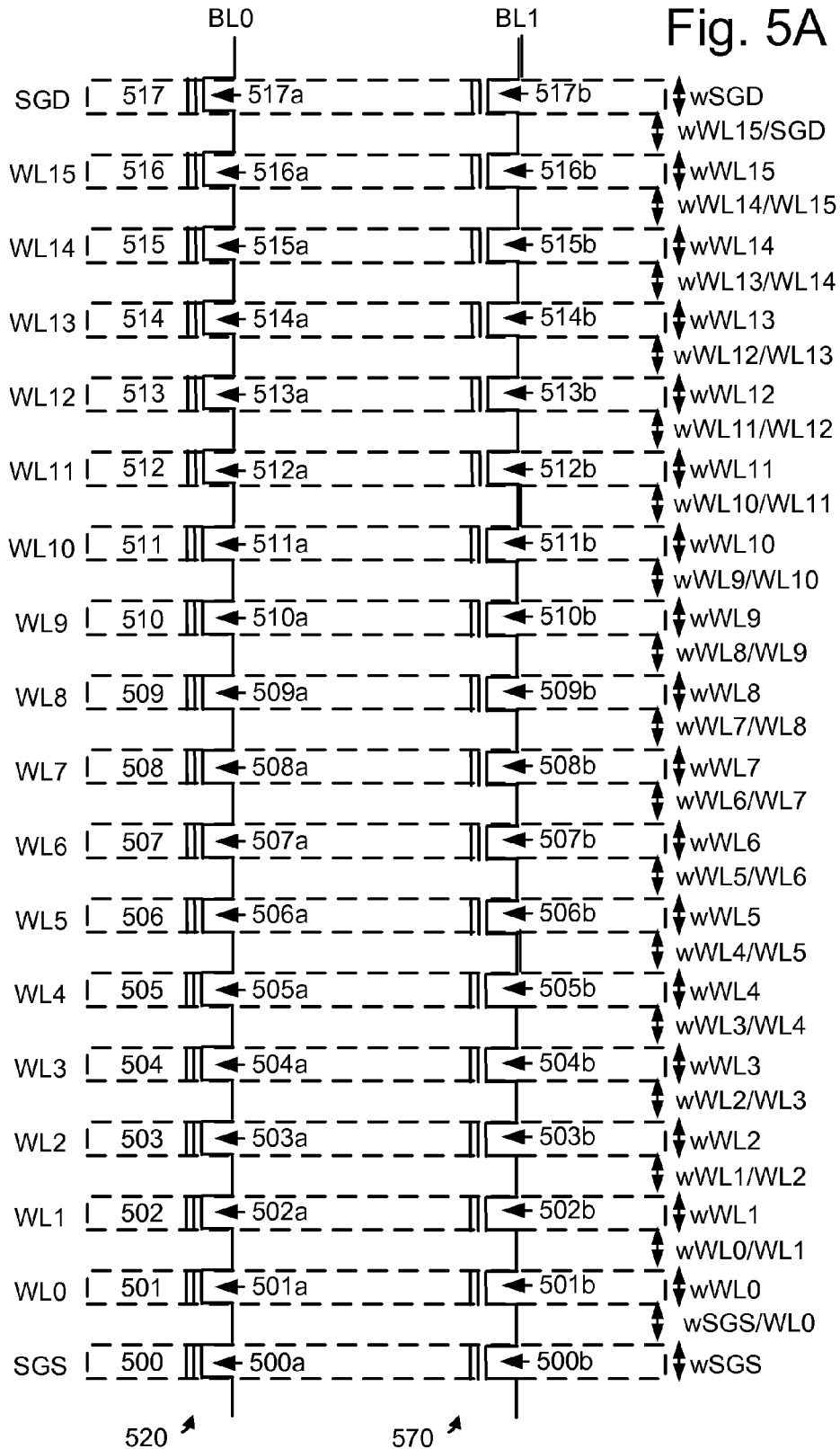
FIG. 5A depicts the block 200 of FIG. 2, showing the widths of word lines and the spaces between word lines.

FIG. 5A depicts the block 200 of FIG. 2, showing the widths of word lines and the spaces between word lines. Example NAND strings 520 and 570 are depicted. The select gate lines and word line have respective widths and spaces. For example, the SGS line 500, WL0 501, WL1 502, WL2 503, WL3 504, WL4 505, WL5 506, WL6 507, WL7 508, WL8 509, WL9 510, WL10 511, WL11 512, WL12 513, WL13 514, WL14 515, WL15 516 and SGD line 517 have respective widths of wSGS, wWL0, wWL1, wWL2, wWL3, wWL4, wWL5, wWL6, wWL7, wWL8, wWL9, wWL10, wWL11, wWL12, wWL13, wWL14, wWL15 and wSGD. Also, inter-word line spaces are depicted. An inter-word line space may be the distance between the edge of one word line and the closest edge of an adjacent word line. The inter-word line spaces are wSGS/WL0, wWL0/WL1, wWL1/WL2, wWL2/WL3, wWL3/WL4, wWL4/WL5, wWL5/WL6, wWL6/WL7, wWL7/WL8, wWL8/WL9, wWL9/WL10, wWL10/WL11, wWL11/WL12, wWL12/WL13, wWL13/WL14, wWL14/WL15 and wWL15/SGD. For example, wWL0/WL1 is the space between WL0 and WL1. In a 2D memory device, the word line width and spacing can be in a plane which is parallel to the substrate, and in a direction which is perpendicular to a direction in which the word lines extend. In a 3D memory device, the word line width and spacing can be in a direction which is perpendicular to the substrate, e.g., as thicknesses of word line layers and inter-word line dielectric layers.

The SGS lines 500 and 517 are connected to select gate transistors 500a and 517a, respectively, in NAND string 520. The word lines WL0 501, WL1 502, WL2 503, WL3 504, WL4 505, WL5 506, WL6 507, WL7 508, WL8 509, WL9 510, WL10 511, WL11 512, WL12 513, WL13 514, WL14 515 and WL15 516 are connected to memory cells 501a, 502a, 503a, 504a, 505a, 506a, 507a, 508a, 509a, 510a, 511a, 512a, 513a, 514a, 515a and 516a, respectively, in NAND string 520.

Similarly, the SGS lines 500 and 517 are connected to select gate transistors 500b and 517b, respectively, in NAND string 570. The word lines WL0 501, WL1 502, WL2 503, WL3 504, WL4 505, WL5 506, WL6 507, WL7 508, WL8 509, WL9 510, WL10 511, WL11 512, WL12 513, WL13 514, WL14 515 and WL15 516 are connected to memory cells 501b, 502b, 503b, 504b, 505b, 506b, 507b, 508b, 509b, 510b, 511b, 512b, 513b, 514b, 515b and 516b, respectively, in NAND string 520.

FIG. 5B is an example plot of the widths of the spaces between the word lines of FIG. 5A. The vertical axis depicts an inter-word line location along a NAND string and the horizontal axis depicts a corresponding width or space. The widths range between a minimum (min) and a maximum (max). Each square represents a data point. In this example, the inter-word line width follows a repeating pattern for adjacent sets 580, 581 and 582 of four word lines. In particular, a relatively high inter-word line space is followed by three relatively low inter-word line spaces. This pattern may result from the double spacer fabrication process for 2D memory. This is merely an example pattern, as other examples are possible.

FIG. 5C is an example plot of the widths of the word lines of FIG. 5A. The vertical axis depicts a word line location along a NAND string and the horizontal axis depicts a corresponding width. Each square represents a data point. In this example, the inter-word line widths do not follow a repeating pattern but vary in a generally random way. A median value is also depicted. It is possible for a pattern in the word line widths to result from the double spacer fabrication process for 2D memory.

The patterns in inter-word line width and word line width can be determined in various ways. In one approach, the widths can be measured from an image of a sample memory device or memory array using a transmission electron microscope, for example. The pattern learned from the sample can be expected to carryover to other memory devices or memory arrays which are fabricated using the same process and machinery.

Figure 6A:
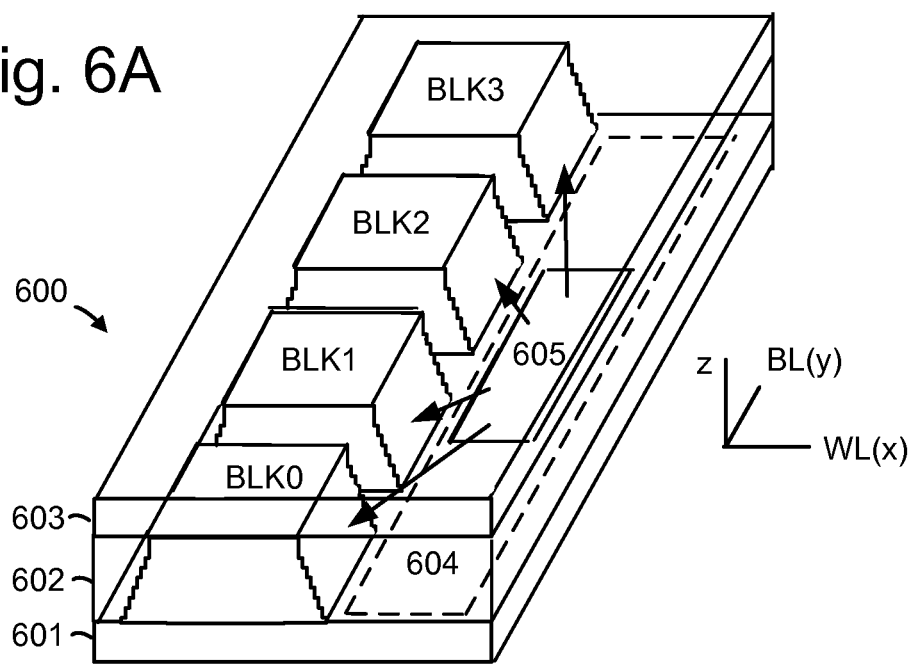
FIG. 6A is a perspective view of a set of blocks in an example three-dimensional configuration of the memory array 126 of FIG. 1.

FIG. 6A is a perspective view of a set of blocks in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole (solid line in FIG. 6C). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (dashed line in FIG. 6C). For example, the memory hole width is a maximum at the level of WL9 in the stack, in this example. The memory hole width is slightly smaller at the level of WL10, and progressively smaller at the levels of WL8 to WL0.

Due to the non-uniformity in the width of the memory hole, the programming and erase speed of the memory cells can vary based on their position along the memory hole, e.g., based on their height in the stack. With a smaller diameter memory hole, the electric field across the tunnel oxide is relatively stronger, so that the programming and erase speed is relatively higher.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7A depicts a top view of an example word line layer WLL10 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. Further, a word line layer in a block can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions WLL10$a$, WLL10$b$, WLL10$c$ and WLL10$d$ which are each connected by a connector 713. The last region of a word line layer in a block can be connected to a first region of a word line layer in a next block, in one approach. The connector, in turn, is connected to a voltage driver for the word line layer. The region WLL10$a$ has example memory holes 710 and 711 along a line 712. See also FIGS. 7B and 8A. The region WLL10$b$ has example memory holes 714 and 715. The region WLL10$c$ has example memory holes 716 and 717. The region WLL10$d$ has example memory holes 718 and 719. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Each circle can alternatively represent a memory cell which is provided by the materials in the memory hole and by the adjacent word line layer.

Metal-filled slits 701, 702, 703 and 704 (e.g., metal interconnects) may be located between and adjacent to the edges of the regions WLL10$a$-WLL10$d$. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. The dielectric layer is divided into regions DL19$a$, DL19$b$, DL19$c$ and DL19$d$. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19$a$ has the example memory holes 710 and 711 along a line 712$a$ which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

FIG. 8B depicts the sub-blocks SBa and SBb of FIG. 8A, showing the widths of word lines and the spaces between word lines. SBd and SB4 are omitted for clarity, but would have respective widths which correspond to those in SBa and SBb. Generally, at a given height in the stack, the word lines at that height in the different sub-blocks will have a common width since they were fabricated from a common conductive layer. Similarly, the dielectric layer portions in different sub-blocks at a given height will have a common width. This width is an inter-word line width since a dielectric layer separates adjacent word lines. Moreover, the common widths can carry over to different blocks. For example, in FIG. 6A, each block BLK0-BLK3 may comprises four sub-blocks, where at a given height above the substrate, each sub-block in the different blocks comprises a layer having a same width or thickness. Also, at a given height above the substrate, each of the different blocks comprises a layer having a same width or thickness. In some cases, sub-blocks are not used.

SBa includes successive layers having respective widths or thicknesses as indicated. The layers and their widths are listed in the format of layer:width as follows: DL19a: wDL19a, SGD0a:wSGD0a, DL18a:wDL18a, SGD1a: wSGD1a, DL17a:wDL17a, DWLD0a:wDWLD0a, DL16a: wDL16a, DWLD1a:wDWLD1a, DL15a:wDL15a, WLL10a:wWLL10a, DL14a:wDL14a, WLL9a:wWLL9a, DL13a:wDL13a, WLL8a:wWLL8a, DL12a:wDL12a, WLL7a:wWLL7a, DL11a:wDL11a, WLL6a:wWLL6a, DL10a:wDL10a, WLL5a:wWLL5a, DL9a:wDL9a, WLL4a:wWLL4a, DL8a:wDL8a, WLL3a:wWLL3a, DL7a:wDL7a, WLL2a:wWLL2a, DL6a:wDL6a, WLL1a: wWLL1a, DL5a:wDL5a, WLL0a:wWLL0a, DL4a: wDL4a, DWLS1a:wDWLS1a, DL3a:wDL3a, DWLS0a: wDWLS0a, DL2a:wDL2a, SGS1a:wSGS1a, DL1a: wDL1a, SGS0a:wSGS0a, and DL0a:wDL0a. As mentioned, the inter-word line widths are equal to the widths of the dielectric layers.

Similarly, SBb includes successive layers having respective widths or thicknesses as indicated. The layers and their widths are listed in the format of layer:width as follows: DL19b:wDL19b, SGD0b:wSGD0b, DL18b:wDL18b, SGD1b:wSGD1b, DL17b:wDL17b, DWLD0b:wDWLD0b, DL16b:wDL16b, DWLD1b:wDWLD1b, DL15b:wDL15b, WLL10b:wWLL10b, DL14b:wDL14b, WLL9b:wWLL9b, DL13b:wDL13b, WLL8b:wWLL8b, DL12b:wDL12b, WLL7b:wWLL7b, DL11b:wDL11b, WLL6b:wWLL6b, DL10b:wDL10b, WLL5b:wWLL5b, DL9b:wDL9b, WLL4b:wWLL4b, DL8b:wDL8b, WLL3b:wWLL3b, DL7b:wDL7b, WLL2b:wWLL2b, DL6b:wDL6b, WLL1b: wWLL1b, DL5b:wDL5b, WLL0b:wWLL0b, DL4b: wDL4b, DWLS1b:wDWLS1b, DL3b:wDL3b, DWLS0b: wDWLS0b, DL2b:wDL2b, SGS1b:wSGS1b, DL1b: wDL1b, SGS0b:wSGS0b, and DL0b:wDL0b.

In a 2D memory device, the word line width and spacing can be in a plane which is parallel to the substrate, and in a direction which is perpendicular to a direction in which the word lines extend. In a 3D memory device, the word line width and spacing can be in a direction which is perpendicular to the substrate, e.g., as thicknesses of word line layers and inter-word line dielectric layers.

FIG. 8C is an example plot of the widths of the spaces between the word lines of FIG. 8B. The vertical axis depicts a dielectric layer location along a NAND string or a height in the stack and the horizontal axis depicts a corresponding width, height or thickness of the layer. A median value is also depicted. Each square represents a data point. In this example, the inter-word line widths do not follow a repeating pattern but vary in a generally random way.

FIG. 8D is an example plot of the widths of the word lines of FIG. 8B. The vertical axis depicts a word line location along a NAND string or a height in the stack and the horizontal axis depicts a corresponding width, height or thickness of the layer. A median value is also depicted. Each square represents a data point. In this example, the inter-word line widths do not follow a repeating pattern but vary in a generally random way. The patterns in inter-word line width and word line width can be determined in various ways as discussed.

Figure 9A:
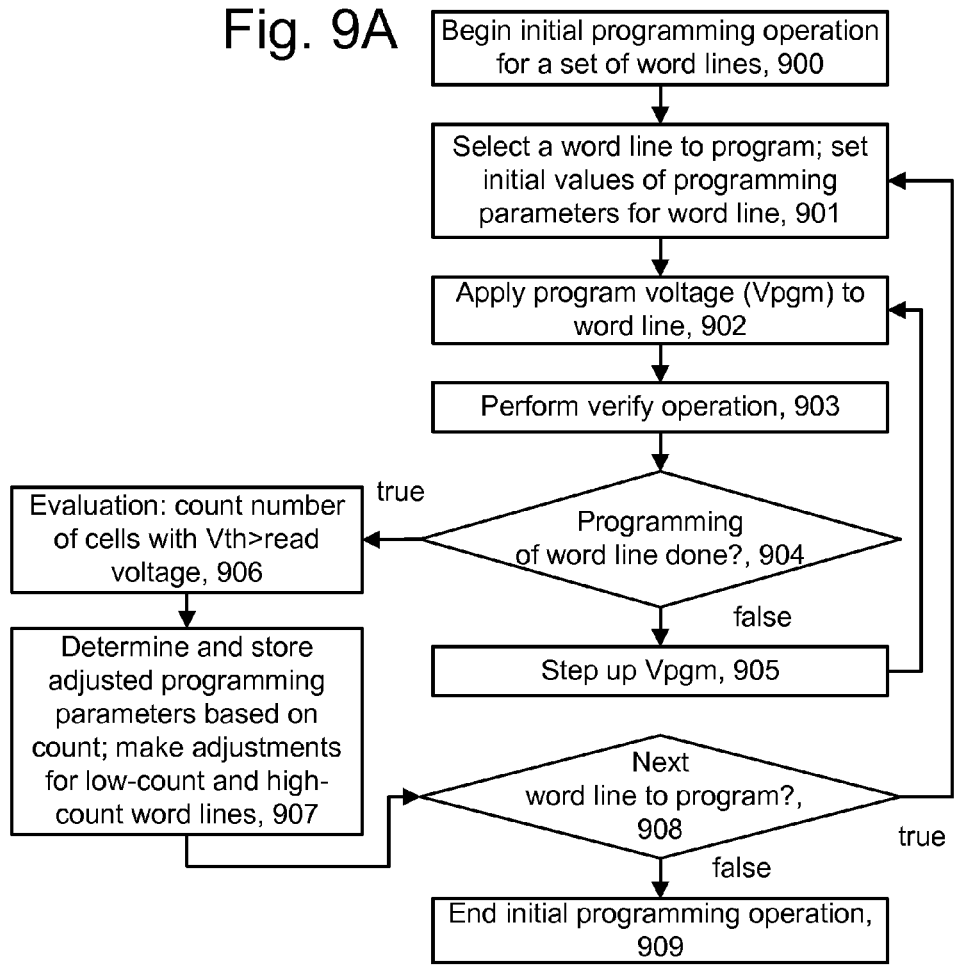
FIG. 9A is a flowchart of an initial programming operation in a memory device.

FIG. 9A is a flowchart of an initial programming operation in a memory device. Step 900 involves beginning an initial programming operation for a set of word lines. Step 901 includes selecting a word line to program, and setting initial values of programming parameters for the word line. For example, the programming parameters can include program voltage step size, initial program voltage, program voltage duration and stabilization time, program-verify voltage, and program mode. Step 902 includes applying the program voltage (Vpgm) to the word line. Step 903 includes performing a verify operation. A decision step 904 determines whether programming of the word line is done. Programming may be done when all, or nearly all, of the cells reach an intended verify voltage. If the programming is done, step 906, an evaluation step, is performed, such as by counting a number of cells with Vth>read voltage. The read voltage may be at the upper tail of the Vth distribution of a data state, so that the count is an indication of the width of the Vth distribution. The count may be proportional to the width of the Vth distribution. Step 907 determines and stores adjusted programming parameters based on the count. In one approach, adjustments are made for low-count word lines (word lines for which the count is relatively low, below a lower limit) and high-count word lines (word lines for which the count is relatively high, above an upper limit) but not medium-count word lines (word lines for which the count is relatively normal, between the lower and upper limits). In another approach, all word lines are eligible for an adjustment. An adjusted value of a programming parameter may be set in proportion to an amount by which the count exceeds the upper limit, in one approach. The adjusted value may also be set in proportion to the count.

For each word line of the one or more low-count word lines, a method includes determining and storing a respective adjusted value of the programming parameter for use in performing subsequent programming of the word line, wherein: a) the initial value of the programming parameter is greater than the adjusted value of the programming parameter for the one or more low-count word lines and is less than the adjusted value of the programming parameter for the one or more high-count word lines, or b) the initial value of the programming parameter is greater than the adjusted value of the programming parameter for the one or more high-count word lines and is less than the adjusted value of the programming parameter for the one or more low-count word lines. For example, the initial value of the step size may by 0.5 V, the adjusted value of the step size for the one or more high-count word lines may be 0.4 V and the adjusted value of the step size for the one or more low-count word lines may be 0.6 V. In case b), the initial value of the programming parameter (0.5 V) is greater than the adjusted value (0.4 V) of the programming parameter for the one or more high-count word lines and is less than the adjusted value (0.6 V) of the programming parameter for the one or more low-count word lines.

Generally, if the count is relatively high, this is an indication that the programming parameters should be adjusted in a way which tends to narrow the Vth distribution. For example, using a lower step size or Vpgm initial, a longer program voltage duration and stabilization time, an increased number of passes and a slow program mode, can narrow the Vth distribution. Program-verify voltages can also be lowered to narrow the Vth distribution. If the count is relatively low, this is an indication that the programming parameters should be adjusted in a way which tends to increase the Vth distribution. For example, using a higher step size or Vpgm initial, a shorter program voltage duration and stabilization time, a reduced number of passes and no slow program mode, can increase the Vth distribution. Program-verify voltages can also be raised to widen the Vth distribution.

Decision step 908 determines whether there is a next word line to program. If there is no next word line to program, step 909 is reached, which is the end of the initial programming operation. If programming of the word line is not done at step 904, Vpgm is stepped up at step 905 and the next program voltage is applied to the word line at step 902.

Figure 9B:
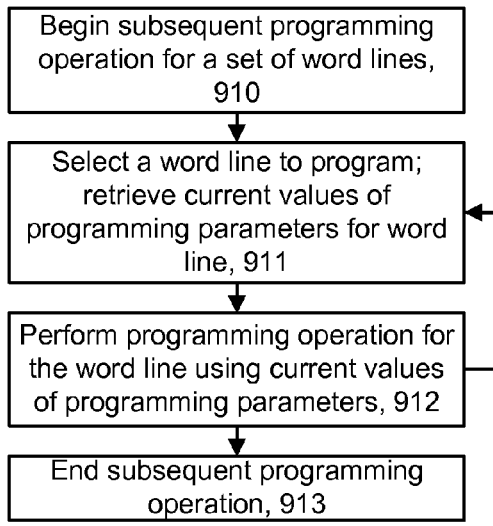
FIG. 9B is a flowchart of a subsequent programming operation in a memory device which follows the initial programming operation of FIG. 9A.

FIG. 9B is a flowchart of a subsequent programming operation in a memory device which follows the initial programming operation of FIG. 9A. Step 910 begins a subsequent programming operation, after the initial programming operation, for a set of word lines. Step 911 selects a word line to program, and retrieves current values of the programming parameters for the word line. These can be the adjusted values of step 907, for example. Step 912 performs a programming operation for the word line using the current values of the programming parameters. After step 912, either step 911 is repeated to program a next word line, or step 913 is reached, where the subsequent programing operation ends.

The initial programming operation and the subsequent programming can be performed when the memory device is at the manufacturer's facility and is being tested and trimmed, and/or when the memory device is at the end user's location.

In some cases, such as for a 3D memory device, the profile of the memory hole is more or less known as fabricated. Further, since the capacitive coupling between word lines is very small, compared to the case of a 2D floating gate memory device, all the information that is needed to adjust the program parameters may be already known, e.g., from die sort tests that are done on the wafer right off the production line. In some cases, the memory device may not need any optimization during operation but rather only during an initial optimization or tuning during the die sort test.

In one approach, the initial values of the programming parameters are the same for each word line. In another approach, the initial values of the programming parameters are customized to each word line, or to each word line in a first set of word lines, where the initial values of the programming parameters are repeated for other sets of word lines which are arranged in a similar pattern of word line widths and/or inter-word line widths as the first set.

The optimum values of the programming parameters result in a corresponding Vth width which is neither too narrow nor too wide. If the Vth width is too narrow, the time spent in programming in unnecessarily long. If the Vth width is too wide, it may not be possible to accurately read back the data in the memory cells having a Vth in the upper tail of the Vth distribution.

The programming speed and resulting Vth width of memory cells of a word line can be affected by the size of the word line. For example, a word line with a relatively small cross-sectional area, based on a relatively small height and/or width, will have a relatively small capacitance. A voltage driver will therefore be able to drive the word line more easily so that its programming speed may be faster than normal, resulting in a wider Vth distribution. On the other hand, a word line with a relatively large cross-sectional area, based on a relatively large height and/or width, will have a relatively large capacitance. A voltage driver will therefore be able to drive the word line with more difficulty so that its programming speed may be slower than normal, resulting in a narrower Vth distribution.

The programming speed and resulting Vth width of memory cells of a selected word line can also be affected by the size of adjacent word lines on either side of the selected word line and respective distances to the adjacent word lines. Generally, an adjacent word line with a relatively large capacitance and smaller distance from the selected word line is more likely to interfere with the selected word line. One example of such interference is capacitive coupling, which tends to widen the Vth distribution on the selected word line after the selected word line has been programmed. A high-capacitance adjacent word line which is after the selected word line in a programming order is therefore more likely to widen the Vth distribution on the selected word line, compared to the widening effect of a high-capacitance adjacent word line which is before the selected word line in a programming order.

Further, for a 3D stacked memory device, the programming speed and resulting Vth width of memory cells of a selected word line can be affected by the width of the portion of the memory hole which is adjacent to, and at a common height in the stack as, the selected word line. The programming speed is higher when the memory hole width is smaller, assuming all other factors are equal.

Variations in the Vth width on different word lines leads to different bit error rates. One approach is to adjust a set of common programming parameters for each word line to minimize the highest bit error rate. However, this results in unnecessary slowing of the programming of the other word lines. The techniques provided herein optimize the programming parameters for each word line to obtain a relatively uniform bit error rate across the word lines. As a result, an optimum balance is achieved between programming speed and bit error rate.

In an example method, the initial values of the programming parameters for a word line can be based on a known distances between that word line and a later-programmed adjacent word line. For example, the programming parameter may comprise a program voltage step size. The initial value (e.g., 0.5 V) of the program voltage step size for one word line (e.g., WL2; WLL2a) of the set of word lines is greater than the initial value (e.g., 0.4 V) of the program voltage step size for another word line (e.g., WL6; WLL6a) of the set of word lines when a distance (e.g., wWL2/WL3, see FIG. 5B; wDL7a, see FIG. 8B) between the one word line and a later-programmed adjacent word line (e.g., WL3; WLL3a) of the one word line is greater than a distance (e.g., wWL6/WL7, see FIG. 5B; wDL11a, see FIG. 8B) between the another word line and a later-programmed adjacent word line (e.g., WL7; WLL7a) of the another word line. The later-programmed adjacent word line of the one word line is programmed after the one word line in a word line programming order of the set of word lines; and the later-programmed adjacent word line of the another word line is programmed after the another word line in the word line programming order of the set of word lines. With the greater inter-word line distance to the later-programmed adjacent word line, a large step size can be used since there is less concern with coupling or other interference between word lines.

In another example method, the initial value of the program voltage step size (e.g., 0.5 V) for one word line (e.g., WL2; WLL2a) of the set of word lines is greater than the initial value (e.g., 0.4 V) of the program voltage step size for another word line (e.g., WL6; WLL6a) of the set of word lines when a width (e.g., wWL3, see FIG. 5B; wWLL3a, see FIG. 8B) of a later-programmed adjacent word line (e.g., WL3; WLL3a) of the one word line is less than a width (e.g., wWL7, see FIG. 5B; wWLL7a, see FIG. 8B) of a later-programmed adjacent word line (e.g., WL7; WLL7a) of the another word line. With the smaller width of the later-programmed adjacent word line, a large step size can be used since there is less concern with coupling or other interference between word lines.

Generally, the adjusting of the programming parameters can occur at different points in the lifetime of a memory device. In one approach, the adjusting occurs when milestones in program-erase cycles have been reached. Each word line in a set of word line such as a block or sub-block can use the same milestones. Or, the milestones can be different for different word lines. In one approach, the number of program-erase cycles until a next adjustment is a function of the analysis of the Vth width. For instance, the number of program-erase cycles until a next adjustment can be relatively lower when the Vth width/count is relatively higher.

An example method includes, for at least one word line of the set of word lines, determining a count of program-erase cycles to perform before re-determining and storing a new respective adjusted value of the programming parameter, wherein the count of program-erase cycles is relatively smaller when the count of the memory cells for which the threshold voltage exceeds the read voltage is relatively higher. This approach determines when to re-evaluate the Vth width for each word line individually.

An example method includes, for the set of word lines, determining a count of program-erase cycles to perform before re-determining and storing a new respective adjusted value of the programming parameter for at least one word line of the set of word line, wherein the count of program-erase cycles is relatively smaller when a count of the high-count word lines is relatively higher. This approach determines when to re-evaluate the Vth width for a set of word lines together. The count of the high-count word lines can be a number of the word lines identified in FIG. 9A as being high-count word lines, and can be some fraction of a set of word lines being programmed.

In one example, for each word line of the one or more high-count word lines, a method includes performing the subsequent programming using the respective adjusted value of the programming parameter, wherein the initial programming is one-pass of a multi-pass programming operation, and the subsequent programming is a subsequent pass in the multi-pass programming operation.

Another example method includes, in connection with subsequent programming of the set of word lines, performing the subsequent programming of each word line of the one or more high-count word lines, wherein the performing the subsequent programming of each word line of the one or more high-count word lines comprises: performing subsequent programming of the word line, wherein the word line comprises memory cells which are to be programmed to the particular state, the subsequent programming is performed using the programming parameter which is set to the adjusted value; after the subsequent programming of the word line, determining a count of the memory cells for which the threshold voltage exceeds the read voltage; and if the count exceeds the upper limit, determining an adjustment to the adjusted value of the programming parameter for use in further programming of the word line, wherein the adjustment is a function of the count of the memory cells for which the threshold voltage exceeds the read voltage in the subsequent programming and the adjusted value of the programming parameter. In this case, the adjustment is based on both the count from the subsequent programming and the adjusted value of the programming parameter used in the subsequent programming. For example, if a step size used in the subsequent programming is relatively high, the adjustment to the step size may be made relatively smaller for a given count. This avoids increasing the step size too quickly when it is already high. As another example, if a step size used in the subsequent programming is relatively low, the adjustment to the step size may be made relatively larger for the given count.

Figure 9C:
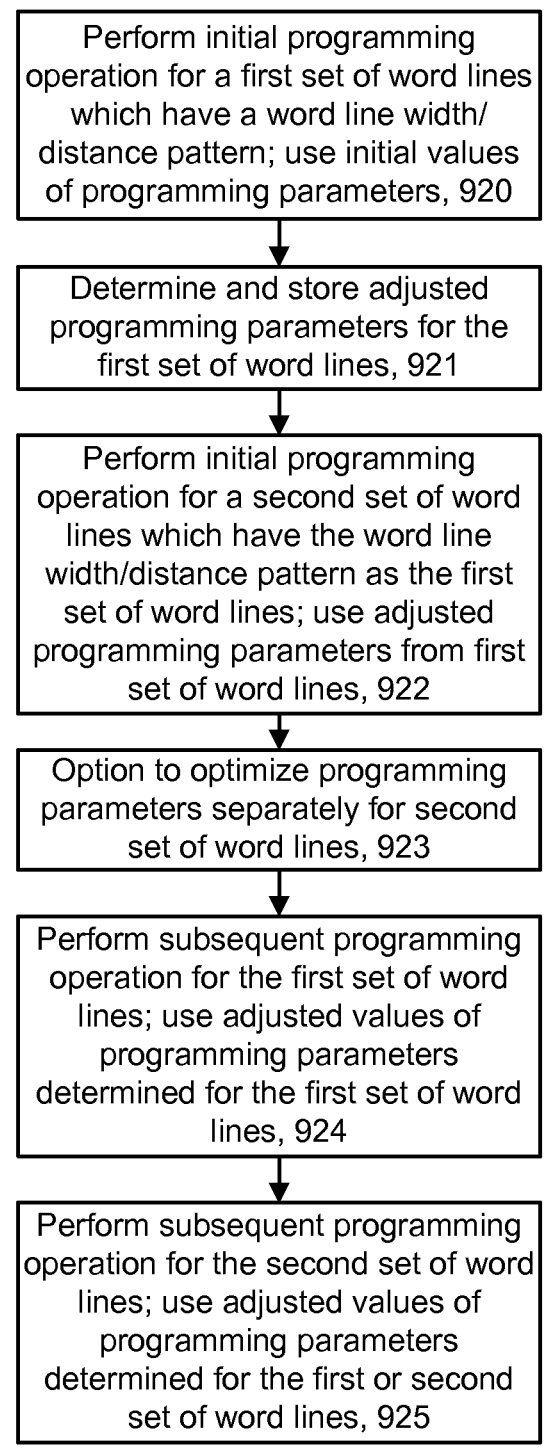
FIG. 9C is a flowchart of programming operations in a memory device which account for a repeating pattern in word line width/distance.

FIG. 9C is a flowchart of programming operations in a memory device which account for a repeating pattern in word line width/distance. As mentioned in connection with FIG. 5B, for example, repeating patterns in word line width and/or distance may be present in the word lines of a memory device. This information can be used to determine an optimum set of programming parameters for the word lines more quickly and with less processing. Step 920 includes performing an initial programming operation for a first set of word lines (e.g., WL12-WL15) which have a certain word line width/distance pattern, while using initial values of programming parameters. Step 921 includes determining and storing adjusted programming parameters for the first set of word lines. Step 922 includes performing initial programming operation for a second set of word lines (e.g., WL8-WL11) which have the same or corresponding word line width/distance pattern as the first set of word lines, using the adjusted programming parameters from first set of word lines. Step 923 includes an option to optimize the programming parameters separately for the second set of word lines. If this option is not selected, the programming parameters are optimized for the first set of word lines and used for the second set of word lines and other sets if desired.

Step 924 includes performing a subsequent programming operation for the first set of word lines, using the adjusted values of programming parameters for the first set of word lines. Step 925 includes performing a subsequent programming operation for the second set of word lines, using the adjusted values of programming parameters determined for the first set of word lines (in case the option of step 923 is not used) or for the second set of word lines (in case the option of step 923 is used).

A related method includes determining, and storing in a storage location, a respective programming parameter for each word line of the first set of word lines based on programming and error evaluation of each word line of the first set of word lines; for each word line of the first set of word lines, use the respective programming parameter for subsequent programming of the word line; and for each word line of the second set of word lines, for programming of the word line, use the respective programming parameter of a respective word line of the first set of word lines for which the respective position within the first set of word lines corresponds to a respective position of the word line of the second set of word lines within the second set of word lines. The error evaluation can determine a count of cells of a data state (e.g., the A state) which have a Vth above a read voltage (e.g., VrB, see FIG. 10A) which distinguishes the data state from a next higher data state (e.g., the B state).

In a 2D memory example, the first set of word lines and the second set of word line are in a block; the first set of word lines are spaced apart from one another at a common height above a substrate; and the second set of word lines are spaced apart from one another at the common height above the substrate.

In a 3D memory example, the first set of word lines comprise a set of conductive layers spaced apart from one another at different heights above a substrate; the second set of word lines comprise a set of conductive layers spaced apart from one another at the different heights above the substrate; and each word line of the second set of word lines is at a common height above the substrate with the respective word line of the first set of word lines in a different block or sub-block than the respective word line of the first set of word lines.

Figure 9D:
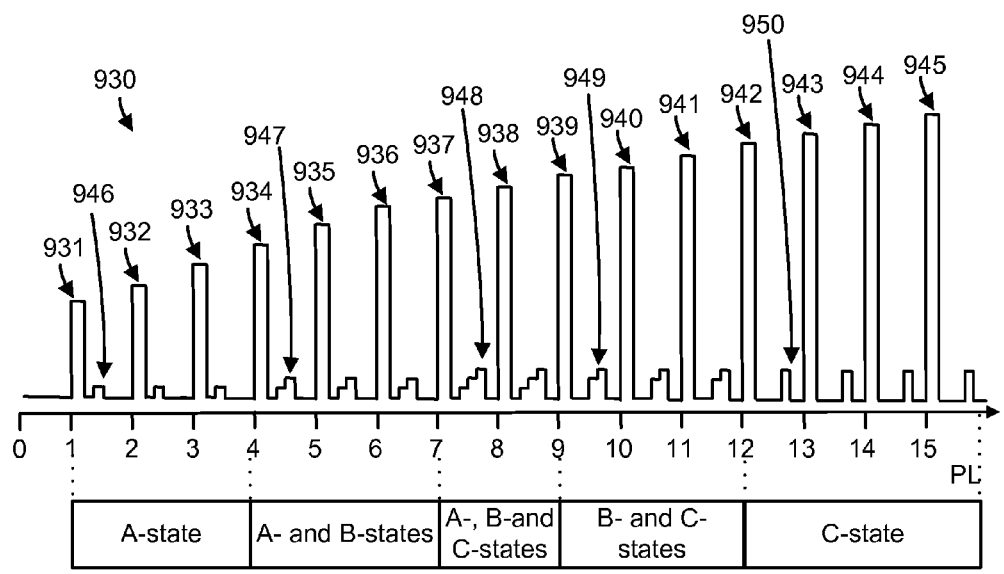
FIG. 9D depicts a waveform of an example programming operation, consistent with FIG. 9A-9C.

FIG. 9D depicts a waveform of an example programming operation, consistent with FIG. 9A-9C. The horizontal axis depicts a program loop number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

For each program voltage, a square waveform is depicted for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming pass in which the programming is completed. ISPP can also be used in each programming pass of a multi-pass operation.

A pulse train typically includes program voltages which increase stepwise in amplitude in each program-verify iteration using a fixed of varying step size. A new pulse train can be applied in each programming pass of a multi-pass programming operation, starting at an initial Vpgm level and ending at a final Vpgm level which does not exceed a maximum allowed level. The initial Vpgm levels can be the same or different in different programming passes. The final Vpgm levels can also be the same or different in different programming passes. The step size can be the same or different in the different programming passes. In some cases, a smaller step size is used in a final programming pass to reduce Vth distribution widths.

The pulse train 930 includes a series of program voltages 931, 932, 933, 934, 935, 936, 937, 938, 939, 940, 941, 942, 943, 944 and 945 that are applied to a word line selected for programming, and an associated set of non-volatile memory cells. One, two or three verify voltages are provided after each program voltage as an example, based on the target data states which are being verified. 0 V may be applied to the selected word line between the program and verify voltages. For example, an A-state verify voltage of VvA (e.g., waveform 946) may be applied after each of the first, second and third program voltages 931, 932 and 933, respectively. A- and B-state verify voltages of VvA and VvB (e.g., waveform 947) may be applied after each of the fourth, fifth and sixth program voltages 934, 935 and 936, respectively. A-, B- and C-state verify voltages of VvA, VvB and VvC (e.g., waveform 948) may be applied after each of the seventh and eighth program voltages 937 and 938, respectively. B- and C-state verify voltages of VvB and VvC (e.g., waveform 949) may be applied after each of the ninth, tenth and eleventh program voltages 939, 940 and 941, respectively. Finally, a C-state verify voltage of VvC (e.g., waveform 950) may be applied after each of the twelfth, thirteenth, fourteenth and fifteenth program voltages 942, 943, 944 and 945, respectively.

Figure 10A:
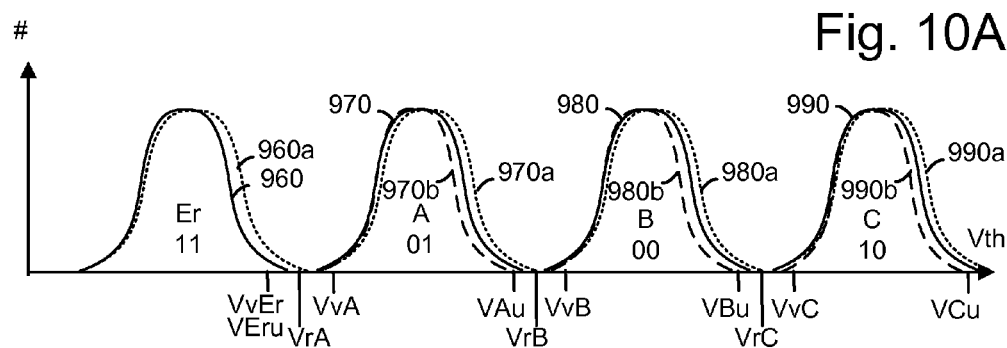
FIG. 10A depicts Vth distributions of memory cells after completion of the initial programming operation of FIG. 9A.

FIG. 10A depicts Vth distributions of memory cells after completion of the initial programming operation of FIG. 9A. In this example, there are four data states, e.g., the erased (Er) which stores bits 11, the A state which stores bits 01, the B state which stores bits 00 and the C state which stores bits 10. Typically, the cells are initially erased to a Vth distribution 960 using an erase-verify voltage VvEr. A small number of erased state cells may have a Vth which is above VvEr due to a bit ignore criteria. The Vth distribution 960a of the erased state may occur after the erased state memory cells are subject to some type of disturbance, such as coupling from neighbor word lines or program disturb.

The A state cells can be programmed in one or more passes from the erased state to their final Vth distribution such as the optimum Vth distribution 970 using the verify voltage of VvA. The Vth distribution 970b is overly narrow and indicates that the programming parameters should be adjusted to speed up programming and thereby widen the Vth distribution to the optimum distribution. The Vth distribution 970a may be overly wide and indicate that the programming parameters should be adjusted to slow down programming and thereby narrow the Vth distribution to the optimum distribution.

Similarly, the B state cells can be programmed in one or more passes from the erased state to their final Vth distribution such as the optimum Vth distribution 980 using the verify voltage of VvB. The Vth distribution 980b is overly narrow and the Vth distribution 980a may be overly wide. The C state cells can be programmed in one or more passes from the erased state to their final Vth distribution such as the optimum Vth distribution 990 using the verify voltage of VvC. The Vth distribution 990b is overly narrow and the Vth distribution 990a may be overly wide.

An example read voltage VERu is used to measure the upper tail of the erased state Vth distribution. This voltage can equal VvEr, as an example. Example read voltages VAu, VBu and VCu are used to measure the upper tail of the A, B and C state Vth distributions, respectively. These read voltages can be used in step 906 in FIG. 9A. Additionally, read voltages VrA, VrB and VrC are used to read the data state of a cell by distinguishing between adjacent data states. The example read voltages VAu, VBu and VCu can be lower than, equal to, or greater than the read voltages VrA, VrB and VrC, respectively. If VAu, VBu and VCu are equal to the read voltages VrA, VrB and VrC, respectively, then VAu, VBu and VCu are read voltages which distinguish between memory cells in a particular state (e.g., Er, A or B, respectively) and memory cells in a next higher state (e.g., A, B or C, respectively). If VAu, VBu and VCu are below the read voltages VrA, VrB and VrC, respectively, then VAu, VBu and VCu are read voltages which are below read voltages which distinguish between memory cells in a particular state and memory cells in a next higher state.

A-state cells that have a Vth>VrA are errored because they will be read as being B state cells. In one approach, when reading the upper tail of A state cells, for example, a read operation may be performed to identify the A state cells, e.g., using the read voltages of VrA, VrB and VrC. The controller can then ignore cells which are not in the A state when obtaining a count of A state cells which have Vth>VAu. Similarly, when reading the upper tail of the B and C state cells, a read operation may be performed to identify the B and C state cells, respectively. Or, a controller of the memory device may store data which identifies the programmed states in another location. In a manufacturing facility, test equipment can be used to identify the data states to which the cells in the memory device were programmed.

In another possible approach, the memory cells can be programmed to a single state such as the A state. The upper tail of this state can then be read to determine the Vth distribution width.

The measuring of the Vth distribution can be for one or more states. If the measuring occurs for different states, an overall result can be obtained from the results from the different states. For example, if a count is obtained for the upper tail of the A, B and C states, a final count which is used to adjust the programming parameters can be obtained as, e.g., a maximum, average or median of the different counts.

Figure 10B:
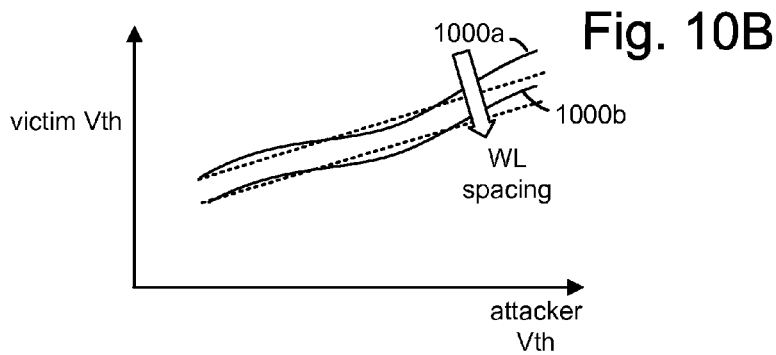
FIG. 10B depicts a plot of a Vth of a victim memory cell versus a Vth of an attacker memory cell on an adjacent word line, showing the effects of capacitive coupling.

FIG. 10B depicts a plot of a Vth of a victim memory cell versus a Vth of an attacker memory cell on an adjacent word line, showing the effects of capacitive coupling. When the memory cells associated with a given word line, e.g., WLn, are programmed, electrons are added to the charge storage region, such as the floating gates, of the cells. Due to capacitive coupling, this charge increases the Vth of the memory cells on the adjacent word lines WLn−1 and WLn+1. This effect can be quantified by measuring the increase in the Vth of the "victim" cells by programming the "attacker" cells on the neighboring word line. The ratio of the victim to attacker Vth increase quantifies the amount of coupling. Because the programming data pattern is random in general, some cells will experience capacitive coupling while others will not. Capacitive coupling is proportional to the amount by which the Vth of the attacker cell exceeds the Vth of the victim cell. Capacitive coupling results in a widened Vth distribution for the adjacent word lines. In a word line programming order in which the word lines are programming one after another, from the source side to the drain side of a memory array or block, capacitive coupling on the previously programmed word line is most damaging. For example, assuming the programming proceeds in this order: WL0, WL1, . . . WLn−1, WLn, WLn+1, . . . capacitive coupling on WLn−1 due to programming of WLn is most damaging. On the other hand, when WLn is programmed, the cells of WLn+1 will be in the erased state. When WLn+1 is subsequently programmed, the A, B and C state cells can reach their normal Vth distributions and only the erased state cells on WLn+1 will have a widened distribution.

However, other word line programming orders may be used which involve partially programming a word line in multiple passes. One example is a two-pass operation which follows this sequence: 1) first pass for WLn−1, 2) first pass for WLn, 3) second pass for WLn−1, 4) first pass for WLn+1, 5) second pass for WLn, . . . . Another example is a three-pass operation which follows this sequence: 1) first pass for WLn−1, 2) first pass for WLn, 3) second pass for WLn−1, 4) first pass for WLn+1, 5) second pass for WLn, 6) third pass for WLn−1, 7) first pass for WLn+2, 8) second pass for WLn+1, 9) third pass for WLn, . . . . While these approaches reduce worst case capacitive coupling, they can still widen the Vth distribution of a partially programmed cell on both adjacent word lines.

A plot $1000a$ depicts the increase in the Vth of the cells of the victim word line when there is a relatively small inter-word line distance between it and the adjacent attacker word line. A plot $1000b$ depicts the increase in the Vth of the cells of the victim word line when there is a relatively large inter-word line distance between it and the adjacent attacker word line. The dashed lines are fitted straight lines to show a trend. The increase in Vth is larger when there is a relatively small inter-word line distance.

Figure 10C:
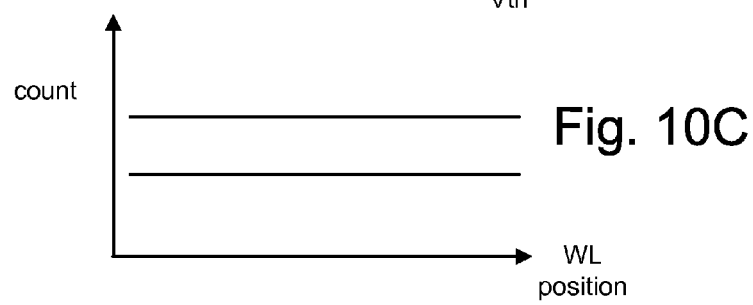
FIG. 10C depicts a plot of minimum and maximum values of a distribution of a count of memory cells in the upper tail of a Vth distribution of a data state, versus word line position, after completion of the initial programming operation of FIG. 9A.

FIG. 10C depicts a plot of a minimum and maximum values of distribution of a count of memory cells in the upper tail of a Vth distribution of a data state, versus word line position, after completion of the initial programming operation of FIG. 9A. This refers, e.g., to the count of step 906 of FIG. 9A. The counts may assume a variety of values between a minimum value and a maximum value which are depicted by respective horizontal lines. In some cases, there may be a pattern to the count value. For example, the pattern may be consistent with a pattern in inter-word line distances, such as depicted in FIG. 5B. A smaller inter-word line distance can result in a larger count.

Figure 10D:
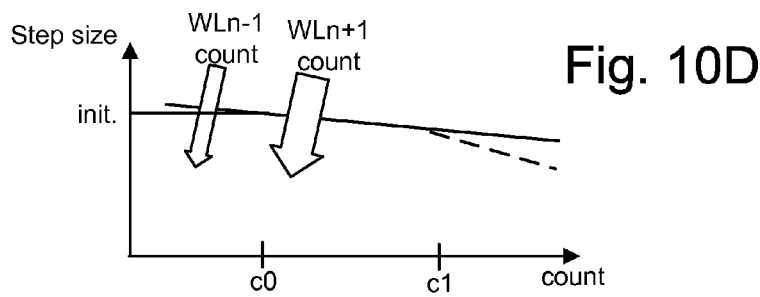
FIG. 10D depicts a plot of an adjusted program voltage step size as a function of a count of memory cells in the upper tail of a Vth distribution of a data state, after completion of the initial programming operation of FIG. 9A.

FIG. 10D depicts a plot of an adjusted program voltage step size as a function of a count of memory cells in the upper tail of a Vth distribution of a data state, after completion of the initial programming operation of FIG. 9A. An initial value (init.) of the step size is also depicted. A count value of c0 corresponds to the initial step size. If the count is greater than c0, the step size can be reduced and, if the count is less than c0, the step size can be increased. In one approach, if the count is greater than a specified level c1, the step size may decrease at a faster rate according to the dashed line based on the theory that the count is in a danger zone which can result in errors. The solid line shows a linear change in step size for all values of the count.

Other factors can affect the step size as well for a given nth word line, WLn. For example, the count from an adjacent word line can be a factor. For example, if the count on WLn−1 or WLn+1 is relatively high, the step size can be adjusted to be relatively lower. Further, the adjustment to the step size can differ based on count values from WLn−1 and WLn+1. For example, the adjustment can be a stronger function of the count on WLn+1 than the count on WLn−1. This is because WLn+1 is the later-programmed word line which is more likely than WLn−1 to cause damaging coupling to WLn.

Figure 10E:
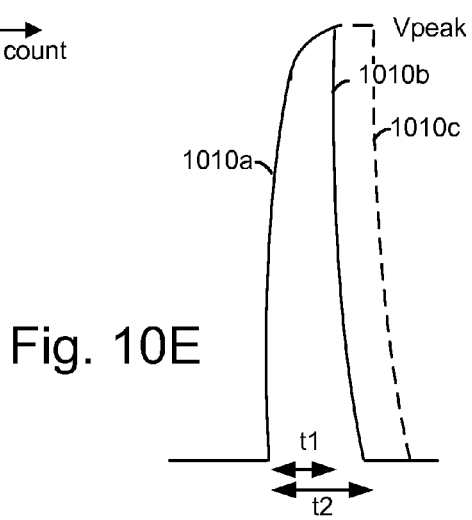
FIG. 10E depicts adjustments to the width of program voltage in a programming operation.

FIG. 10E depicts adjustments to the width of program voltage in a programming operation. A program voltage requires a finite amount of time to reach a desired level due to an RC time constant of the word line. The waveform portions $1010a$ and $1010b$ represent a rise and subsequent fall in the program voltage in a time period t1. The waveform portions $1010a$ and $1010c$ represents a rise and subsequent fall in the program voltage in a time period t2>t1. These time period are also the program voltage widths or durations. When the program voltage duration is relatively longer, the programming can be made more accurate since the voltage is at a peak level, Vpeak, for a relatively longer time. Accordingly, a relatively longer program voltage can be used to narrow the Vth distribution if indicated by the count or other measure of Vth distribution width.

FIGS. 11A and 11B depict Vth distributions of memory cells in an example one-pass programming operation with four data states, consistent with FIG. 9A-9C. In this example, the memory cells are initially in the erased state (bits 11) as represented by the Vth distribution 1100. Subsequently, the programming causes the Vth of the A, B and C state cells to reach the Vth distributions 1102, 1104 and 1106, respectively. A small number of A, B and C state cells may have a Vth which is below VvA, VvB or VvC, respectively, due to a bit ignore criteria.

FIG. 11C depicts Vth distributions of memory cells after a first pass (a foggy pass) and a second pass (a fine pass) of an example two-pass programming operation with four data states, consistent with FIG. 9A-9C. In this example, the first programming pass causes the Vth of the A, B and C state cells to reach the Vth distributions 1102a, 1104a and 1106a, respectively, using verify voltages of VvAf, VvBf and VvCf, respectively. This first pass can be a rough programming which uses a relatively large step size, for instance, so that the Vth distributions 1102a, 1104a and 1106a are relatively wide. The second pass may use a smaller step size and causes the Vth distributions 1102a, 1104a and 1106a to transition to the final Vth distributions 1102, 1104 and 1106, respectively, which are relatively narrow. This two-pass programming operation can achieve relatively narrow Vth distributions.

FIG. 11D depicts Vth distributions of memory cells in a one-pass programming operation which uses a slowdown measure. During a programming operation, when the Vth of a cell is close to the final verify voltage, the programming speed of the cell can be slowed down. For example, when the Vth of an A, B or C state cell exceeds VvAL, VvBL or VvCL, respectively, the programming speed can be slowed by raising an associated bit line voltage to an intermediate level, between 0 V and a lockout level, during the subsequent programming voltages. Once the A, B or C state cell exceeds the final verify voltage of VvA, VvB or VvC, respectively, the cell can be locked out from further programming by raising the associated bit line voltage to a lockout voltage during subsequent programming voltages. The zones between VvAL and VvA, VvBL and VvB, and VvCL and VvC, represent zones in which the slow programming is used for the A, B and C state cells, respectively.

FIG. 12A to 12C depict Vth distributions of memory cells in a two-pass programming operation with four data states, consistent with FIG. 9A-9C. Each pass can be used to program a page of data. For example, programming of lower and upper pages in two-bit, four-level memory cells is provided. Programming can be performed one logical page at a time, with the lower page followed by the upper page. Initially, all memory cells are in the erased (Er) state, represented by the Vth distribution 1200.

FIG. 12B depicts programming of a lower page of data. If the lower page has a bit=1, the associated memory cell remains in the Vth distribution 1200 and the data is represented by x1, where x is an upper page bit that is not yet known. If the lower page has a bit=0, the memory cell is programmed to a higher Vth as represented by distribution 1202, which is an interim distribution (INT), using a verify voltage VvINT. The data of these memory cells is represented by x0. Note that the interim distribution can be relatively wide since it is not a final distribution and does not represent a final data state.

FIG. 12C depicts programming of an upper page of data. If UP/LP=11, the associated memory cell in the Vth distribution 1200 remains in the Vth distribution 1200 and stores data bits 11. If UP/LP=01, the memory cells in the Vth distribution 1200 are programmed to the Vth distribution 1204. If UP/LP=10, the memory cells in the Vth distribution 1202 are programmed to the Vth distribution 1208. If UP/LP=00, the memory cells in the Vth distribution 1202 are programmed to the Vth distribution 1206. The example read levels and program-verify voltages discussed previously are also depicted. Programming can be similarly extended to three or more bits per memory cell.

FIG. 13A to 13D depict Vth distributions of memory cells in a three-pass programming operation with eight data states, consistent with FIG. 9A-9C. Programming of lower, middle and upper pages in three-bit, eight-level memory cells is depicted. Seven programmed data states A through G are used in addition to Er for eight states total. Initially, all memory cells are in the Er state, represented by the Vth distribution 1300. The lower page (LP) is programmed in FIG. 13B. If LP=1, memory cells in distribution 1300 remain in that distribution. If LP=0, memory cells in distribution 1300 are programmed to an interim distribution 1302 using Vv1. The middle page is programmed in FIG. 13C. If MP=1, memory cells in distribution 1300 remain in that distribution, and memory cells in distribution 1302 are programmed to interim distribution 1308 using verify voltage Vv4. If MP=0, memory cells in distribution 1300 are programmed to interim distribution 1304 using verify voltage Vv2, and memory cells in distribution 1302 are programmed to interim distribution 1306 using verify voltage Vv3.

The upper page (UP) is programmed in FIG. 13D. If UP=1, memory cells in distribution 1300 remain in that distribution, memory cells in distribution 1304, 1306 or 1308 are programmed to distribution 1314 (state C), distribution 1316 (state D), or distribution 1322 (state G), respectively.

If UP=0, memory cells in distribution 1300, 1304, 1306 or 1308 are programmed to distribution 1310 (state A), distribution 1312 (state B), distribution 1318 (state E) and distribution 1320 (state F), respectively. Programming using four bits per cell (16 levels) can similarly involve four pages.

FIG. 14A to 14C depict Vth distributions of memory cells in a two-pass programming operation with eight data states, consistent with FIG. 9A-9C. This example differs from FIG. 13A-13D in that one less programming pass is used. Initially, all memory cells are in the Er state, represented by the Vth distribution 1400. The lower page is programmed in FIG. 14B. If LP=1, memory cells in distribution 1400 remain in that distribution. If LP=0, memory cells in distribution 1400 are programmed to an interim distribution 1402 using Vv1. The middle and upper pages are programmed together in FIG. 14C. If UP/MP=11, memory cells in distribution 1400 remain in that distribution. If UP/MP=01, 00 or 10, memory cells in distribution 1400 are programmed to final Vth distributions 1410, 1412 and 1414, respectively. If UP/MP=10, 00, 01 or 11, memory cells in the Vth distribution 1402 are programmed to final Vth distributions 1416, 1418, 1420 and 1422, respectively.

As mentioned, a program mode can be selected based on the Vth distribution. In one approach, when the Vth is too wide, the program mode can be set to narrow the Vth distribution. This approach can include increasing a number of programming passes, using a slowdown measure where one was not previously used, and using a stronger slowdown measure (e.g., a higher bit line voltage) where a weaker slowdown measure (e.g., a lower bit line voltage) was previously used.

A related method determines a first program mode for use in subsequent programming of the at least one word line of the set of word lines for which the respective initial error count exceeds the upper limit; and determines a second program mode, different than the first program mode, for use in subsequent programming of at least one word line of the set of word lines for which the respective initial error count does not exceed the upper limit. The first program mode uses a number N of programming passes during the subsequent programming of the at least one word line of the set of word lines for which the respective initial error count exceeds the upper limit; the second program mode uses a number M<N of programming passes during the subsequent programming of the at least one word line of the set of word lines for which the respective initial error count does not exceed the upper limit; and N is an integer of two or more and M is an integer of one or more.

Accordingly, it can be seen that, in one embodiment, a method for operating a memory device comprises: performing initial programming of a set of word lines. The performing initial programming of the set of word lines comprises: performing initial programming of each word line of the set of word lines, one word line at a time, wherein each word line comprises memory cells which are to be programmed to a particular state, the programming is performed using a programming parameter which is set to an initial value, and the programming parameter controls a width of a threshold voltage distribution of the memory cells resulting from the initial programming of the word line; for each word line of the set of word lines, after the initial programming of the word line, determining a count of the memory cells for which a threshold voltage exceeds a read voltage; identifying one or more high-count word lines of the set of word lines for which the count exceeds an upper limit; and for each word line of the one or more high-count word lines, determining and storing a respective adjusted value of the programming parameter for use in subsequent programming of the word line.

In another embodiment, a memory device comprises means for performing each of the steps in the above-mentioned method.

In another embodiment, a memory device comprises: a set of word lines, each word line comprising memory cells; a storage location; and a control circuit. The control circuit, to perform initial programming of the set of word lines, is configured to: apply to each word line of the set of word lines, one word line at a time, an initial set of program voltages which increase by a respective step size to program memory cells of the word line to a state; for each word line of the set of word lines, to determine a respective initial error count, for the memory cells which were programmed to the state, read the memory cells to determine a respective count of the memory cells which have a threshold voltage which does not correspond to a threshold voltage range of the state; and for each word line of the set of word lines for which the respective initial error count exceeds an upper limit, store an indication of the count in the storage location, the indication of the count indicating a susceptibility to error by the word line.

In another embodiment, a memory device comprises: a first set of word lines, wherein the word lines of the first set of word lines are spaced apart from one another by a pattern of inter-word line distances, and each word line of the first set of word lines has a respective position with the first set of word lines; a second set of word lines, wherein the word lines of the second set of word lines are spaced apart from one another by a pattern of inter-word line distances which corresponds to the pattern of inter-word line distances of the first set of word lines, each word line of the second set of word lines has a respective position with the second set of word lines; a storage location; and a control circuit. The control circuit is configured to: determine, and store in the storage location, a respective programming parameter for each word line of the first set of word lines based on programming and error evaluation of each word line of the first set of word lines; and for each word line of the first set of word lines, use the respective programming parameter for subsequent programming of the word line; and for each word line of the second set of word lines, for programming of the word line, use the respective programming parameter of a respective word line of the first set of word lines for which the respective position within the first set of word lines corresponds to a respective position of the word line of the second set of word lines within the second set of word lines.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for operating a memory device, comprising:
performing initial programming of memory cells connected to a set of word lines, the initial programming comprising programming of memory cells of each word line of the set of word lines, one word line at a time, wherein the initial programming is performed using a programming parameter set to an initial value, and the programming parameter controls a width of a threshold voltage distribution of the memory cells resulting from the initial programming of the memory cells of the word line;
for each word line of the set of word lines, after the initial programming of the memory cells of the word line, determining a count of the memory cells for which a threshold voltage exceeds a read voltage;
identifying one or more high-count word lines of the set of word lines for which the count exceeds an upper limit;
for each word line of the one or more high-count word lines, determining a respective adjusted value of the programming parameter for use in performing subsequent programming of the memory cells of the word line;
identifying one or more low-count word lines of the set of word lines for which the count is less than a lower limit, lower than the upper limit; and
for each word line of the one or more low-count word lines, determining a respective adjusted value of the programming parameter for use in performing subsequent programming of the memory cells of the word line.

2. The method of claim 1, further comprising:
identifying one or more medium-count word lines for which the count is between the lower limit and the upper limit; and
for each word line of the one or more medium-count word lines, performing the subsequent programming of memory cells of the word line without adjusting the programming parameter.

3. The method of claim 1, wherein:
the read voltage distinguishes between memory cells in a particular state and memory cells in a next higher state.

4. The method of claim 1, wherein:
the read voltage is below a read voltage which distinguishes between memory cells in a particular state and memory cells in a next higher state.

5. The method of claim 1, further comprising:
for each word line of the one or more high-count word lines, performing the subsequent programming using the respective adjusted value of the programming parameter, wherein the initial programming is one-pass of a multi-pass programming operation, and the subsequent programming is a subsequent pass in the multi-pass programming operation.

6. The method of claim 1, further comprising:
for each word line of the one or more high-count word lines, setting the respective adjusted value of the programming parameter in proportion to an amount by which the count exceeds the upper limit.

7. The method of claim 1, wherein:
the initial value of the programming parameter is greater than the respective adjusted value of the programming parameter for the one or more low-count word lines and is less than the respective adjusted value of the programming parameter for the one or more high-count word lines.

8. The method of claim 1, wherein:
the programming parameter comprises a program voltage step size;
the initial value of the program voltage step size for one word line of the set of word lines is greater than the initial value of the program voltage step size for another word line of the set of word lines when a distance between the one word line and a later-programmed adjacent word line of the one word line is greater than a distance between the another word line and a later-programmed adjacent word line of the another word line;
memory cells of the later-programmed adjacent word line of the one word line are programmed after memory cells of the one word line in a word line programming order of the set of word lines; and
memory cells of the later-programmed adjacent word line of the another word line are programmed after memory cells of the another word line in the word line programming order of the set of word lines.

9. The method of claim 1, wherein:
the programming parameter comprises a program voltage step size;
the initial value of the program voltage step size for one word line of the set of word lines is greater than the initial value of the program voltage step size for another word line of the set of word lines when a width of a later-programmed adjacent word line of the one word line is less than a width of a later-programmed adjacent word line of the another word line;
memory cells of the later-programmed adjacent word line of the one word line are programmed after memory cells of the one word line in a word line programming order of the set of word lines; and
memory cells of the later-programmed adjacent word line of the another word line are programmed after memory cells of the another word line in the word line programming order of the set of word lines.

10. The method of claim 1, further comprising:
for at least one word line of the set of word lines, determining a count of program-erase cycles to perform before re-determining a new respective adjusted value of the programming parameter, wherein the count of program-erase cycles is relatively smaller when the count of the memory cells for which the threshold voltage exceeds the read voltage is relatively higher.

11. The method of claim 1, further comprising:
for the set of word lines, determining a count of program-erase cycles to perform before re-determining a new respective adjusted value of the programming parameter for at least one word line of the set of word line, wherein the count of program-erase cycles is relatively smaller when a count of the one or more high-count word lines is relatively higher.

12. The method of claim 1, wherein for each word line of the one or more high-count word lines:
the performing the subsequent programming uses the respective adjusted value of the programming parameter;
after the subsequent programming of the memory cells of the word line, a count is determined of memory cells of the word line for which the threshold voltage exceeds the read voltage; and
if the count exceeds the upper limit, an adjustment to the respective adjusted value of the programming parameter is determined for use in further programming of the memory cells of the word line, wherein the adjustment is a function of the count of the memory cells for which the threshold voltage exceeds the read voltage in the subsequent programming and the respective adjusted value of the programming parameter.

13. The method of claim 1, wherein:
the initial value of the programming parameter is greater than the respective adjusted value of the programming parameter for the one or more high-count word lines and is less than the respective adjusted value of the programming parameter for the one or more low-count word lines.

14. A memory device, comprising:
a set of word lines, each word line connected to memory cells;
a storage location; and
means for performing initial programming of the memory cells of the set of word lines, the means for performing initial programming comprising:
means for applying to each word line of the set of word lines, one word line at a time, an initial set of program voltages which increase by a respective step size to program memory cells of the word line to a state;
means for determining, for each word line of the set of word lines, a respective initial error count, for the memory cells which were programmed to the state, read the memory cells to determine a respective count of the memory cells which have a threshold voltage which does not correspond to a threshold voltage range of the state; and
means for storing, for each word line of the set of word lines for which the respective initial error count exceeds an upper limit, an indication of the count in the storage location, the indication of the count indicating a susceptibility to error by the word line;
means for determining a first program mode for use in subsequent programming of memory cells of at least one word line of the set of word lines for which the respective initial error count exceeds the upper limit; and
means for determining a second program mode, different than the first program mode, for use in subsequent programming of memory cells of at least one word line of the set of word lines for which the respective initial error count does not exceed the upper limit.

15. The memory device of claim 14, further comprising:
means for determining a first number of program-erase cycles to perform before re-determining a respective error count for at least one word line of the set of word lines for which the respective initial error count exceeds the upper limit, wherein the first number of program-erase cycles is relatively smaller when the respective initial error count for the at least one word line is relatively higher.

16. The memory device of claim 14, wherein:
the first program mode imposes a first slowdown measure during the subsequent programming of memory cells of the at least one word line of the set of word lines for which the respective initial error count exceeds the upper limit; and
the second program mode does not impose a slowdown measure or imposes a slowdown measure which is less severe than the slowdown measure of the first program mode, during the subsequent programming of memory cells of the at least one word line of the set of word lines for which the respective initial error count does not exceed the upper limit.

17. The memory device of claim 14, wherein:
the first program mode uses a number N of programming passes during the subsequent programming of memory cells of the at least one word line of the set of word lines for which the respective initial error count exceeds the upper limit;
the second program mode uses a number M<N of programming passes during the subsequent programming of memory cells of the at least one word line of the set of word lines for which the respective initial error count does not exceed the upper limit; and
N is an integer of two or more and M is an integer of one or more.

18. A memory device, comprising:
a stack having a top and a bottom, the stack comprising alternating conductive layers and dielectric layers, wherein:
each conductive layer comprises a word line connected to memory cells;
the memory cells are arranged along memory holes in the stack; and
the memory holes are tapered, narrowing at a bottom of the stack; and
a control circuit configured to:
perform initial programming of the memory cells of each word line, one word line at a time, using a programming parameter which is set to an initial value, wherein for each word line, the initial value of the programming parameter is based on a position of the word line in the stack, and the programming parameter controls a width of a threshold voltage distribution of the memory cells;
for each word line, after the initial programming of the word line, determine a count of the memory cells for which a threshold voltage exceeds a read voltage;
identify one or more high-count word lines for which the count exceeds an upper limit; and
for each word line of the one or more high-count word lines, determine a respective adjusted value of the programming parameter for use in subsequent programming of the memory cells of the word line, wherein for each word line of the one or more high-count word lines, a difference between the initial value of the programming parameter and the respective adjusted value of the programming parameter is relatively higher when the position is relatively closer to the bottom of the stack than to the top of the stack.

19. The memory device of claim 18, wherein the control circuit is configured to:
identify one or more medium-count word lines for which the count is between the lower limit and the upper limit; and
for each word line of the one or more medium-count word lines, perform the subsequent programming of memory cells of the word line without adjusting the programming parameter.

20. The memory device of claim 15, further comprising:
means for determining, for at least one word line for which the respective initial error count does not exceed the upper limit, a second number of program-erase cycles to perform before determining a respective new error count, wherein the second number of program-erase cycles is larger than the first number of program-erase cycles.

* * * * *